(12) United States Patent (10) Patent No.: US 8,813,002 B2
Tanisho (45) Date of Patent: Aug. 19, 2014

(54) CIRCUIT BOARD DESIGN SUPPORT PROGRAM, DESIGN SUPPORT METHOD, AND DESIGN SUPPORT APPARATUS

(71) Applicant: Fujitsu Limited, Kawasaki (JP)

(72) Inventor: Motoyuki Tanisho, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/013,079

(22) Filed: Aug. 29, 2013

(65) Prior Publication Data

US 2014/0123088 A1 May 1, 2014

(30) Foreign Application Priority Data

Oct. 26, 2012 (JP) .................................. 2012-237187

(51) Int. Cl.
*G06F 17/50* (2006.01)

(52) U.S. Cl.
CPC ...................................... *G06F 17/50* (2013.01)
USPC ............ 716/101; 716/102; 716/104; 716/106

(58) Field of Classification Search
CPC ............ G06F 17/5045; G06F 17/5068; G06F 17/5081; G06F 17/5077; H05K 1/0201; H05K 1/116; H05K 2201/062; H05K 2201/0969; H05K 3/0005; H05K 3/429
USPC ........................... 716/101, 102, 104, 106, 107
See application file for complete search history.

(56) References Cited

U.S. PATENT DOCUMENTS

| 7,181,715 | B2 * | 2/2007 | Sato et al. ..................... 716/102 |
| 7,444,612 | B2 * | 10/2008 | Ariyama et al. ............... 716/100 |
| 7,703,064 | B2 * | 4/2010 | Ashida et al. .................. 716/137 |
| 2008/0126931 | A1 | 5/2008 | Kojima et al. |
| 2012/0192140 | A1 * | 7/2012 | Sadamatsu et al. ........... 716/137 |

FOREIGN PATENT DOCUMENTS

| JP | 2000-047909 | 2/2000 |
| JP | 2003-091435 | 3/2003 |
| JP | 2006-093824 | 4/2006 |
| JP | 2008-117093 | 5/2008 |

* cited by examiner

*Primary Examiner* — Sun Lin
(74) *Attorney, Agent, or Firm* — Fujitsu Patent Center

(57) ABSTRACT

The embodiment is a non-transitory computer readable storage medium storing a design support program which causes a computer to generate design data for a circuit board in which elements are placed. The program causes the computer to perform: storing, in response to an operation input, operation information in an operation storage section; storing a function of a program executed based on the operation input in a function history storage section; upon detection of an operation of a command causing the computer to execute a predetermined function for generating the design data, acquiring a selected element and storing the selected element in an element information storage section; and detecting an abnormal end of the predetermined function to output the function of the program in the function history storage section, the operation information in the operation information storage section, and the element in the element information storage section to a log file.

11 Claims, 29 Drawing Sheets

110 {
[COMMAND HISTORY]
Place Component
Completion of Component Placement
Change Component Attribute
Completion of Component Attribute Change
Move
Completion of Move
FPGA Editor 111 {
[FUNCTION HISTORY]
C:¥programfiles¥BP¥FpgaEditor.dll   CConnectLineLink
C:¥windows¥SYSTEM¥ntdll.dll   RtlFreeHeap
C:¥windows¥SYSTEM¥kernel32.dll   HeapFree
C:¥programfiles¥BP¥Core.dll   Ccore
C:¥windows¥SYSTEM¥ntdll.dll   RtlFreeHeap
...
C:¥programfiles¥BP¥Move.dll   SetUndotitle
C:¥programfiles¥BP¥Move.dll   MoveFigure
...
C:¥programfiles¥BP¥MeBP.exe   SetUndotitle
C:¥programfiles¥BP¥MeBP.exe   CClass
...
C:¥programfiles¥BP¥ToolAddFig.dll   SetUndotitle
C:¥programfiles¥BP¥ToolAddFig.dll   AddFig
...

FIG. 8

[OPERATION INFORMATION]
1 Design Diagram 01, Screen 100, Mouse, x: 265 mm and y: 215 mm, and Left Click:
2 Design Diagram 01, Screen 100, Mouse, x: 265 mm and y: 215 mm, and Right Click:
3 Design Diagram 01, Screen 100, Pop-Up Menu, Mouse, Command (Change Element Attribute), and Left Click:

47

[ELEMENT INFORMATION]
1 Component (M15)

48

[FUNCTION HISTORY]
1 C:¥programfiles¥BP¥MeBP.exe    Cclass
2 C:¥programfiles ¥BP¥Core.dll    CCoreFn2
3 C:¥windows¥System32¥kernel32.dll    vc90
...

49

[COMMAND HISTORY]
...
Change Component Attribute

50

131

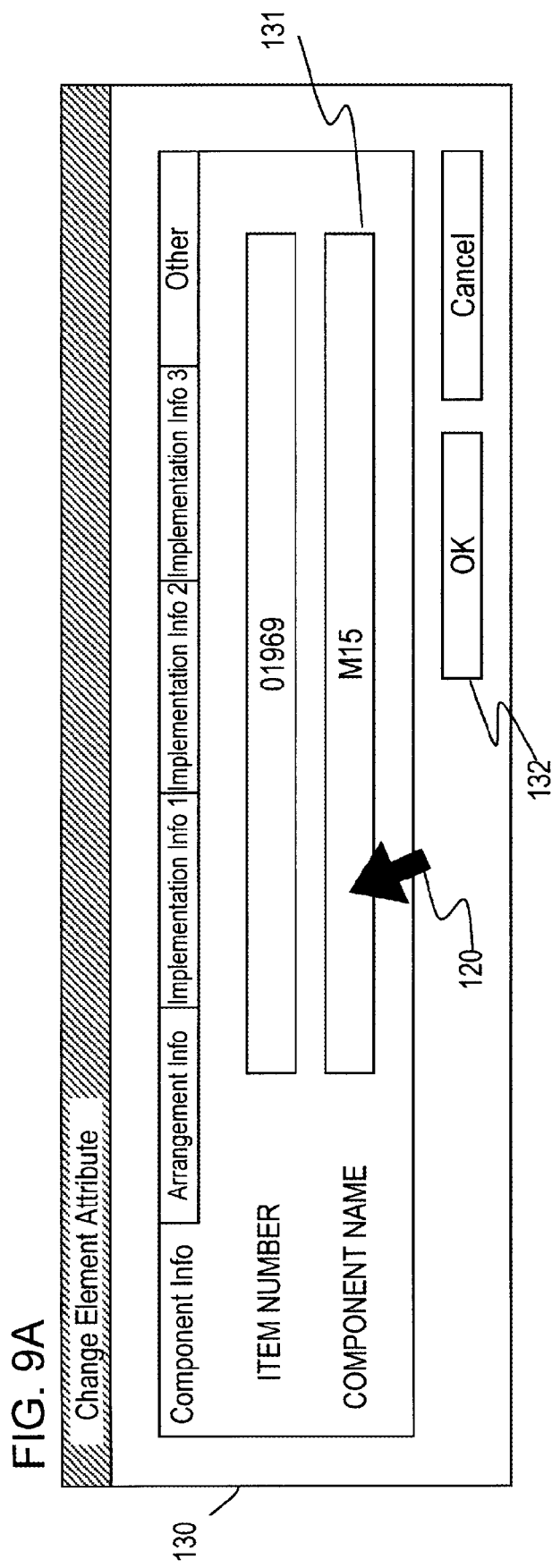

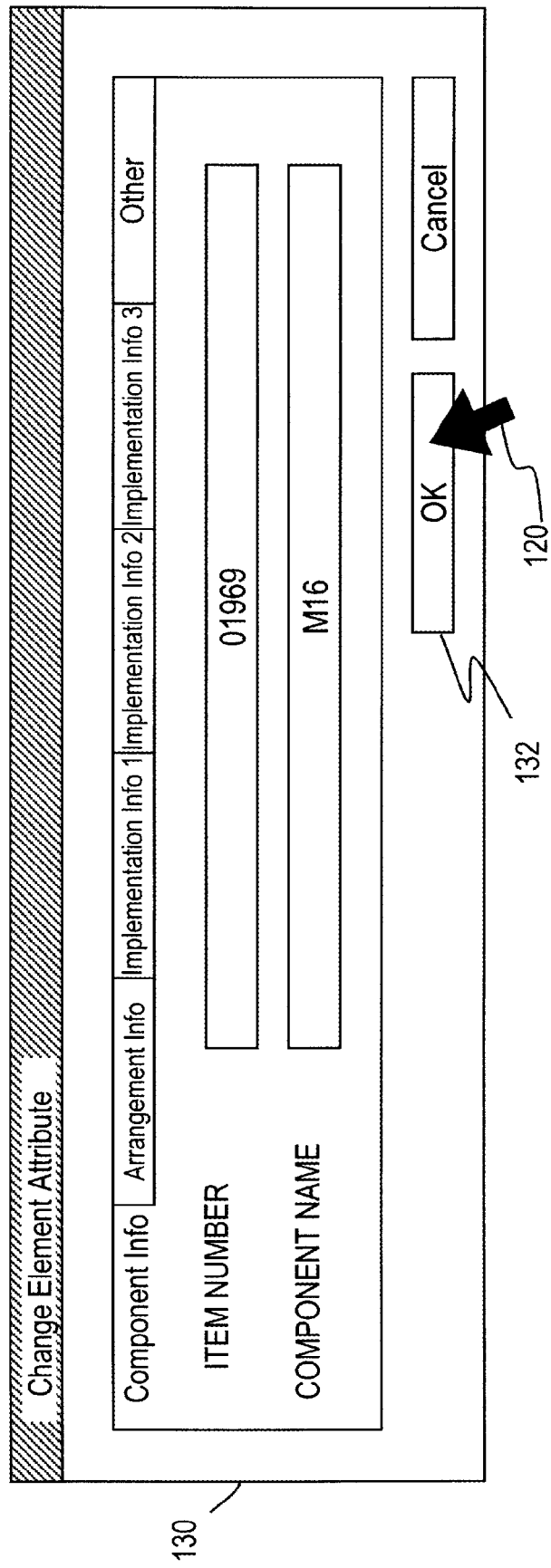

FIG. 10

47 — [OPERATION INFORMATION]
1 Design Diagram 01, Screen 100, Mouse, x: 265 mm and y: 215 mm, and Left Click
2 Design Diagram 01, Screen 100, Mouse, x: 265 mm and y: 215 mm, and Right Click
3 Design Diagram 01, Screen 100, Pop-Up Menu, Mouse, Command (Change Element Attribute), and Left Click
4 Design Diagram 01, Element-Information Change 130, Component Information, Mouse, Component Name, and Left Click
5 Design Diagram 01, Element-Information Change 130, Component Information, Keyboard, and Delete
6 Design Diagram 01, Element-Information Change 130, Component Information, Keyboard, and Delete
7 Design Diagram 01, Element-Information Change 130, Component Information, Keyboard, and Delete
8 Design Diagram 01, Element-Information Change 130, Component Information, Keyboard, and M
9 Design Diagram 01, Element-Information Change 130, Component Information, Keyboard, and 1
10 Design Diagram 01, Element-Information Change 130, Component Information, Keyboard, and 6
11 Design Diagram 01, Element-Attribute Change 130, Component Information, Mouse, OK, and Left Click 48 — [ELEMENT INFORMATION]
1 Component (M15)

49 — [FUNCTION HISTORY]
1 C:¥programfiles¥BP¥MeBP.exe    SetUndo
2 C:¥programfiles¥BP¥MeBP.exe    Function
3 C:¥programfiles¥BP¥MeBP.exe    Cclass
4 C:¥programfiles ¥BP¥Core.dll    CCoreFn2
5 C:¥windows¥System32¥kernel32.dll    vc90
...

50 — [COMMAND HISTORY]
...
Change Component Attribute
Completion of Component Attribute Change   } 141

141 — [COMMAND HISTORY]
...
Completion of Component Attribute Change

142 — [OPERATION INFORMATION]
1 Design Diagram 01, Screen 100, Mouse, x: 265 mm and y: 215 mm, and Left Click:
2 Design Diagram 01, Screen 100, Mouse, x: 265 mm and y: 215 mm, and Right Click:
3 Design Diagram 01, Screen 100, Pop-Up Menu, Mouse, Command (Change Element Attribute), and Left Click:
4 Design Diagram 01, Element-Information Change 130, Component Information, Mouse, Component Name, and Left Click:
5 Design Diagram 01, Element-Information Change 130, Component Information, Keyboard, and Delete:
6 Design Diagram 01, Element-Information Change 130, Component Information, Keyboard, and Delete:
7 Design Diagram 01, Element-Information Change 130, Component Information, Keyboard, and Delete:
8 Design Diagram 01, Element-Information Change 130, Component Information, Keyboard, and 1:
9 Design Diagram 01, Element-Information Change 130, Component Information, Keyboard, and Convert:
10 Design Diagram 01, Element-Information Change 130, Component Information, Keyboard, l, Enter:
11 Design Diagram 01, Element-Attribute Change 130, Component Information, Mouse, OK, and Left Click:

143 — [ELEMENT INFORMATION]
1 Component (M15)

144 — [FUNCTION HISTORY]
1 C:¥programfiles¥BP¥MeBP.exe    Function
2 C:¥programfiles¥BP¥MeBP.exe    Cclass
3 C:¥programfiles ¥BP¥Core.dll    CCoreFn2
4 C:¥windows¥System32¥kernel32.dll    vc90
...

[COMMAND HISTORY]
...
Move

{ 141

[OPERATION INFORMATION]
1 Design Diagram 01, Screen 100, Mouse, x: 120 mm-200 mm and y: 240 mm-100 mm, and Left Click:
2 Design Diagram 01, Screen 100, Mouse, x: 200 mm and y: 100 mm, and Right Click:
3 Design Diagram 01, Screen 100, Pop-Up Menu, Mouse, Command (Move), and Left Click:
4 Design Diagram 01, Screen 100, Mouse, x: 220 mm and y: 140 mm, and Left Click:

{ 142

[ELEMENT INFORMATION]
1 Component (L11)
2 Component (C11)
3 Component (GND11)
4 Figure (Ob11)
5 Character String (COM11)

{ 143

[FUNCTION HISTORY]
1 C:¥programfiles¥BP¥Move.dll    MoveFigure
...

[OPERATION INFORMATION]
1 Design Diagram 01, Screen 100, Menu 101, Mouse, Command (Component Input), and Left Click:
2 Design Diagram 01, Component Input Screen 401, Mouse, Library Access Key Column 402, and Left Click:
3 Design Diagram 01, Component Input Screen 401, Library Access Key Column 402, Keyboard, and C:
4 Design Diagram 01, Component Input Screen 401, Library Access Key Column 402, Keyboard, and A:
5 Design Diagram 01, Component Input Screen 401, Library Access Key Column 402, Keyboard, and 4:
6 Design Diagram 01, Component Input Screen 401, Library Access Key Column 402, Keyboard, and 6:
7 Design Diagram 01, Component Input Screen 401, Library Access Key Column 402, Keyboard, and 5:
8 Design Diagram 01, Component Input Screen 401, Mouse, Search, and Left Click:
9 Design Diagram 01, Component Input Screen 401, Search Result Column 404, Mouse, First Row, and Left Click:
10 Design Diagram 01, Screen 100, Mouse, x: 400 mm and y: 210 mm, and Left Click:

[ELEMENT INFORMATION]
1 Integrated Circuit (CA46500 – 0002 )

[FUNCTION HISTORY]
1 C:\programfiles\BP\ToolAddFig.dll    SetUndotitle
2 C:\programfiles\BP\ToolAddFig.dll    AddFig
...

[COMMAND HISTORY]
...
Place Component
Completion of Component Placement

[COMMAND HISTORY] — 141

...

Place Component

[OPERATION INFORMATION] — 142
1 Design Diagram 01, Screen 100, Menu 101, Mouse, Command (Component Input), and Left Click:
2 Design Diagram 01, component input screen 401, Mouse, library access key column 402, and Left Click:
3 Design Diagram 01, component input screen 401, library access key column 402, Keyboard, and C:
4 Design Diagram 01, component input screen 401, library access key column 402, Keyboard, and A:
5 Design Diagram 01, component input screen 401, library access key column 402, Keyboard, and 9:
6 Design Diagram 01, component input screen 401, library access key column 402, Keyboard, and 9:
7 Design Diagram 01, component input screen 401, library access key column 402, Keyboard, and 9:
8 Design Diagram 01, component input screen, Mouse, Search, and Left Click:

[ELEMENT INFORMATION] — 143
1

[FUNCTION HISTORY] — 144
1 C:¥programfiles¥BP¥ToolAddFig.dll    AddFig

...

CIRCUIT BOARD DESIGN SUPPORT PROGRAM, DESIGN SUPPORT METHOD, AND DESIGN SUPPORT APPARATUS

CROSS-REFERENCE TO RELATED APPLICATION

This application is based upon and claims the benefit of priority of the prior Japanese Patent Application No. 2012-237187, filed on Oct. 26, 2012, the entire contents of which are incorporated herein by reference.

FIELD

The present invention relates to a design support program, a design support method, and a design support apparatus.

BACKGROUND

In the design of a circuit board, a designer uses a design support program such as CAD to perform placement and routing of components over a printed board and produce design data. In the event of the occurrence of an abnormal end while the design support program is in use, the designer makes an inquiry to the developer of the design support program. In response thereto, the developer analyzes a log file output from the design support program to identify the cause of the abnormal end and makes correction of the design support program or the like.

The followings documents relate to the design support program.

Patent Document 1: Japanese Patent Application Publication No. 2008-117093
Patent Document 2: Japanese Patent Application Publication No. 2006-93824
Patent Document 3: Japanese Patent Application Publication No. 2000-47909
Patent Document 4: Japanese Patent Application Publication No. 2003-91435

SUMMARY

However, even when the developer analyzes the log file which is output log information about the executed program function, it is difficult for the developer to specifically recognize the type of the operation performed by the designer at the abnormal end. As a result, the developer needs to analyze the log file and also identify the cause of the abnormal end by reproducing the situation at the abnormal end, while checking the content of the operation at the abnormal end with the designer. Therefore, it has been difficult to promptly respond to the abnormal end.

An embodiment is a non-transitory computer readable storage medium storing a design support program which causes a computer to generate design data for a circuit board in which elements are placed, the program causing the computer to perform: storing, in response to an operation input, operation information in an operation storage section; storing a function of a program executed based on the operation input in a function history storage section; upon detection of an operation of a command causing the computer to execute a predetermined function for generating the design data, acquiring a selected one of the elements and storing the selected element in an element information storage section; and detecting an abnormal end of the predetermined function to output the function of the program in the function history storage section, the operation information in the operation information storage section, and the element in the element information storage section to a log file.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a view illustrating an example of the log file.

FIG. 8 is a view illustrating an example of the operation information table, the element information table, the function history table, and the log file when the "Change Element Attribute" command is selected in the first embodiment.

FIGS. 9A and 9B are views each illustrating an example of an element attribute changing operation in the first embodiment.

FIG. 10 is a view illustrating an example of the operation information table, the element information table, the function history table, and the log file at the completion of the "Change Element Attribute" command in the first embodiment.

FIG. 11 illustrates an example of the log file which is output at the abnormal end in the first embodiment.

FIG. 16 illustrates an example of the log file which is output at the abnormal end in the second embodiment.

FIG. 21 is a view illustrating a second example of the operation of editing pins in the integrated circuit in the fourth embodiment.

FIG. 27 is a view illustrating an example of the operation information table, the element information table, the function history table, and the log file at the completion of the "Place Component" command in the fourth embodiment.

FIG. 28 illustrates an example of the log file which is output at the abnormal end in the fourth embodiment.

DESCRIPTION OF EMBODIMENTS

Using the drawings, a description will be given below of the embodiments of the present invention.

Figure 1:
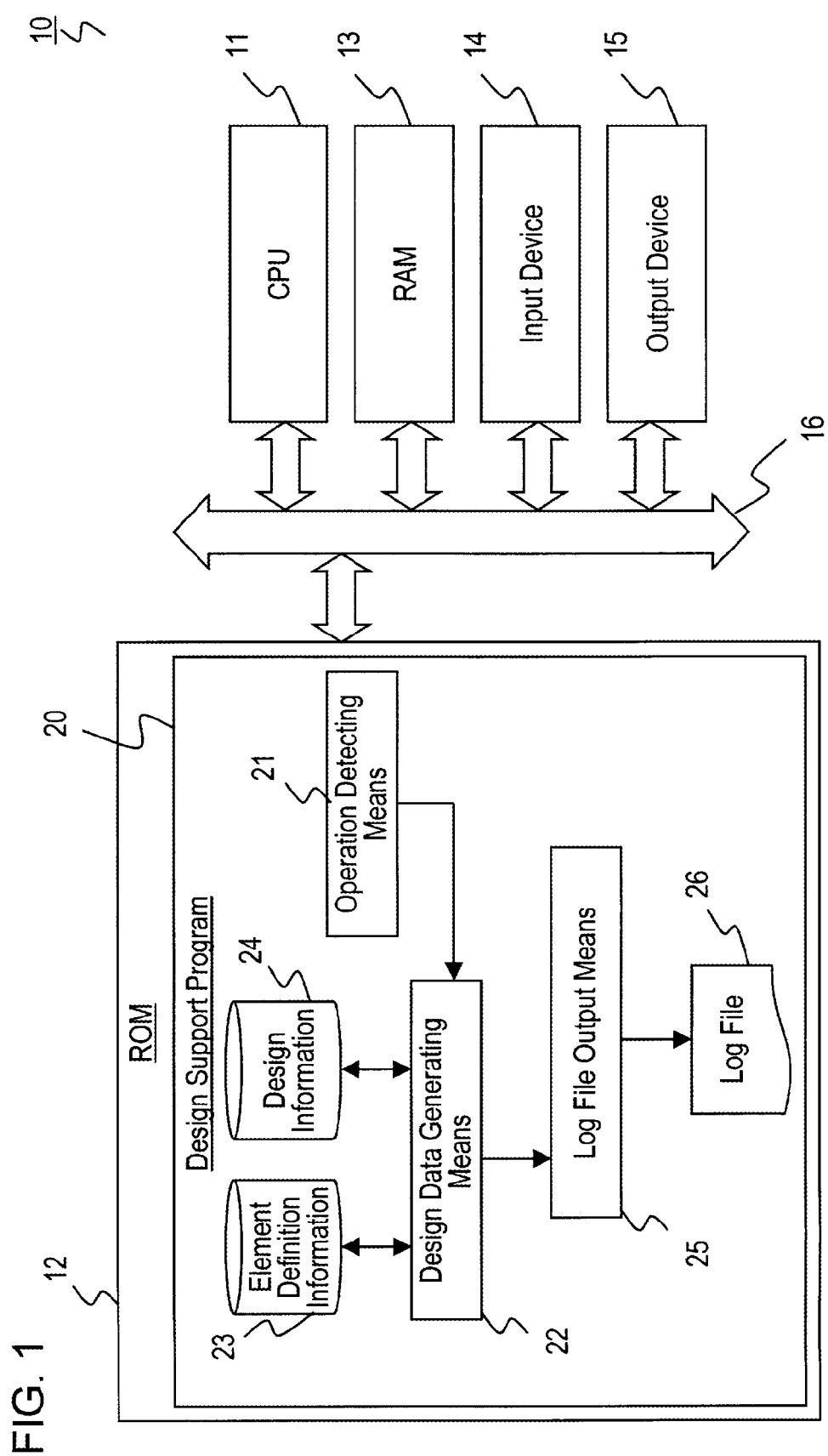
FIG. 1 is a view illustrating a configuration of a design support apparatus for a circuit board.

FIG. 1 is a view illustrating a configuration of a design support apparatus for a circuit board. A design support apparatus 10 in FIG. 1 has a CPU 11, a ROM 12, a RAM 13, an input device 14 such as a mouse and a keyboard, an output device 15 such as a display, and a bus 16.

The ROM 12 stores various programs, such as a design support program 20 described later, and data needed to execute the programs. The RAM 13 stores the various programs loaded by the CPU 11 from the ROM 12, temporary data, and the like.

The CPU 11 executes the various programs stored in the ROM 12 to control the design support apparatus 10. For example, the CPU 11 executes the design support program to implement an operation detecting means 21 for detecting an operation input via the input device 14, a design data generating means 22 for reading an element from an element definition information table 23 storing therein elements defined in advance to newly generate design data for the circuit board or reading the design data from a design information table 24 to update the design data and store the updated design data in the design information table 24, and a log file output means 25 for outputting the history of execution of a command and a program function to a log file 26. Note that an operation indicates an operation performed by a designer on the input device 14 so as to perform the selection of an element or a command, the inputting of a character, the pressing of a displayed button, or the like on a screen 100 displayed on the output device 15 described later. The elements stored in the element definition information table 23 are elements included in the design data for the circuit board such as a capacitor, a resistor, an integrated circuit, a signal line, a single coupler, a power source, a figure, and a text box.

Figure 2:
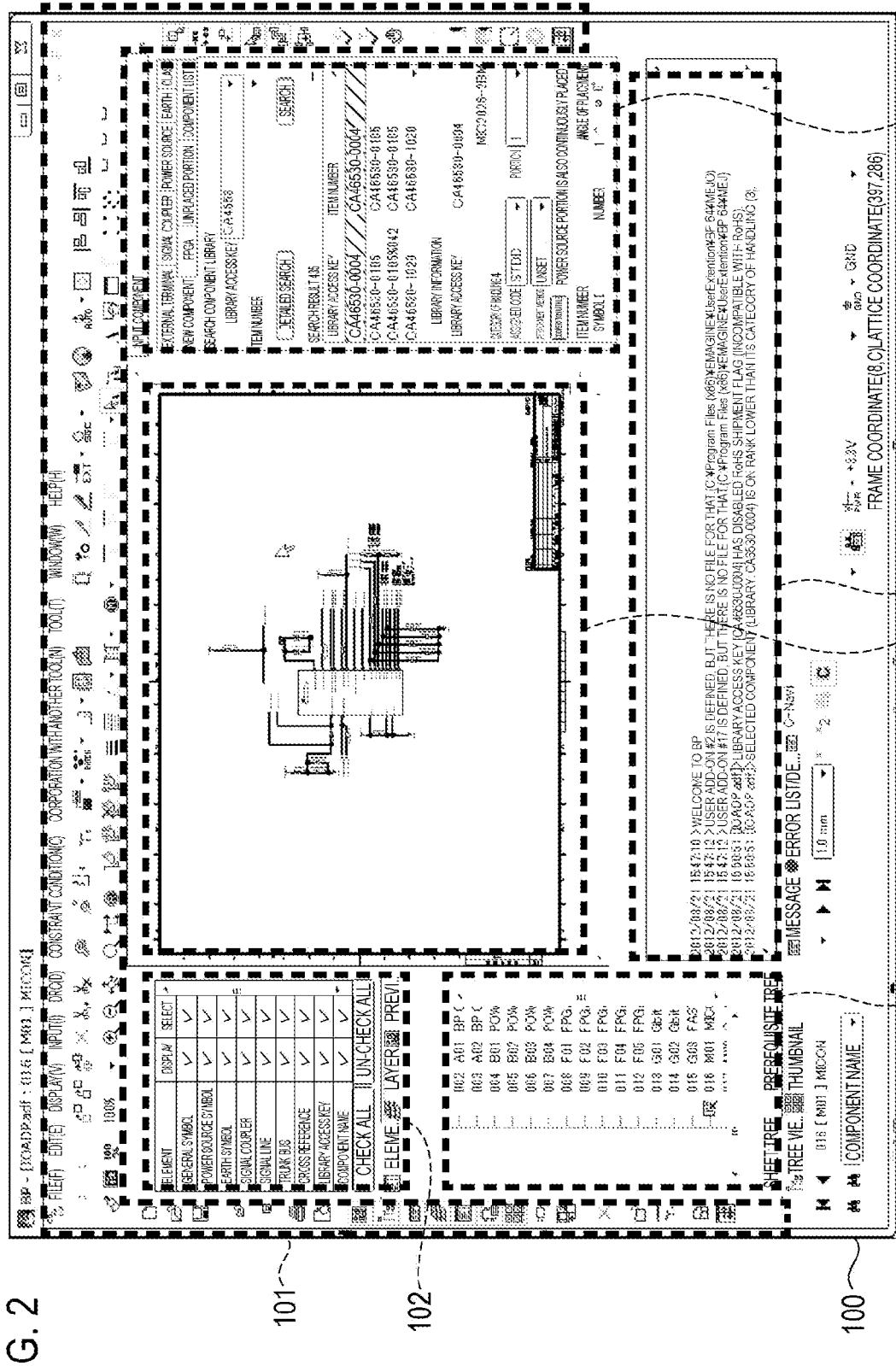
FIG. 2 is a view illustrating an example of the screen of the design support program.

FIG. 2 is a view illustrating an example of the screen of the design support program. In response to the operation of the input device 14 by the designer, the CPU 11 activates the design support program 20 and displays the screen 100 on the output device 15.

The screen 100 has a menu 101 which displays commands, an element control section 102 which allows the display/non-display of each of the elements in a design diagram display section 104 and the selectability/non-selectability thereof to be set, a board selecting section 103 which displays the design data stored in the design information table 24, the design diagram display section 104 which displays the design data being worked on, a component selecting section 105 which reads a component from the element definition information table 23 and allows the component to be selected, and a message section 106 which displays the result of execution of a command and the like.

A command is an instruction for causing the design support program to execute functions needed by the designer to produce the design data, such as the placement/routing of the elements, the movement/removal of the elements, the change of the attributes of the elements, and the setting of constraint conditions.

The designer operates the input device 14 to select a command from the menu 101, executes the command, and performs the placement and routing of components on the design diagram display section 104 and the like to produce the design data. As will be described later, the designer can also select the element included in the design data in the design diagram display section 104 and operate the mouse of the input device 14 on the selected element to select the command. Through the selection of a "save" command by the designer, the design data in the design diagram display section 104 is stored in the design information table 24.

FIG. 3 is a view illustrating an example of the log file. Upon selection of the command by the designer, the program function corresponding to the command is executed. The histories of the selected command and the program function executed in response thereto are respectively output to a command history section 110 and a function history section 111 in the log file 26.

When executing the command in response to the operation of selecting the command by the designer, the CPU 11 outputs the name of the command to the command history section 110. When normally ending the command, the CPU 11 outputs the notification of the completion of the command to the command history section 110.

For example, in the command history section 110 of FIG. 3, it is illustrated that the CPU 11 executed a "Place Component" command for placing a component, a "Change Component Attribute" command for changing an attribute of the component such as the name thereof, and a "Move" command for moving the component to any coordinate which were normally ended and then executed a "FPGA Editor" command for changing the placement of pins in the integrated circuit, an attribute thereof, or the like. In the command history section 110 of FIG. 3, it is also illustrated that, since the notification that the "FPGA Editor" command was completed has not been output to the command history section 110, the log file 26 is in either of a state where the "FPGA Editor" command is being executed or a state where the "FPGA Editor" command was abnormally ended during the execution thereof.

When executing a command, the CPU 11 outputs the name of the program function executed in correspondence to the command and the path of a module having the program function to the function history section 111. For example, to the function history section 111 of FIG. 3, the names of the executed program functions and the paths of the modules having the program functions have been output and arranged in an ascending order. Accordingly, as has been output into the uppermost row in the function history section 111, the finally executed program function is a program function "ConnectLineLink" in a module "FpgaEditor.dll" present in a path "C:¥ Programfiles¥ BP".

Normally, in the development of a design support program, when the CPU 11 abnormally ends during the production of design data due to the retrieval of unexpected data or the like, the designer provides the log file 26 to which the history of the commands and the program functions that were executed by the CPU 11 before the abnormal end had been output to the developer of the design support program and requests a response such as the identification of the cause. However, since one program function may correspond to a plurality of commands or operations, there may be a case where, even when analyzing the log file to which the history of the executed program functions had been output, the developer is unable to specifically recognize the operation performed by the designer at the abnormal end. In such a case, the developer needs to perform an analysis operation while checking the designer with the content of the operation at the abnormal end so that a prompt response is difficult.

For example, when the abnormal end occurs during the execution of the "FPGA Editor" command, as illustrated in FIG. 3, the log file 26 is output. By checking the uppermost row in the function history section 111, the developer may recognize the occurrence of the abnormal end during the execution of the program function "ConnectLineLink" in the module "FpgaEditor.dll" present in the path "C:¥ Programfiles¥ BP".

However, from the log file 26, it is unclear on which one of the elements included in the design data which was being produced by the designer the "FPGA Editor" command was executed. In addition, since the "FPGA Editor" command allows operations such as the change of the placement of pins in the integrated circuit and the change of an attribute to be performed and the program function "ConnectLineLink" in the module "FpgaEditor.dll" is used for each of the operations, the type of the operation performed by the designer immediately before the abnormal end is also unclear.

Moreover, since the developer analyzes the abnormally ended "FPGA Editor" command, the history of the program functions corresponding to the "Place Component" command, the "Change Component Attribute" command, and the "Move" command which were normally ended is not needed.

Accordingly, as will be described later, the design support program in the present embodiment outputs only the portions of the history (operation history) of the operations by the designer, the target element (element information) on which the command was executed, and the history of the executed program functions which are needed for the analysis to the log file to allow the developer to promptly recognize the situation at the abnormal end based on the log file and respond to the abnormal end.

Figure 4:
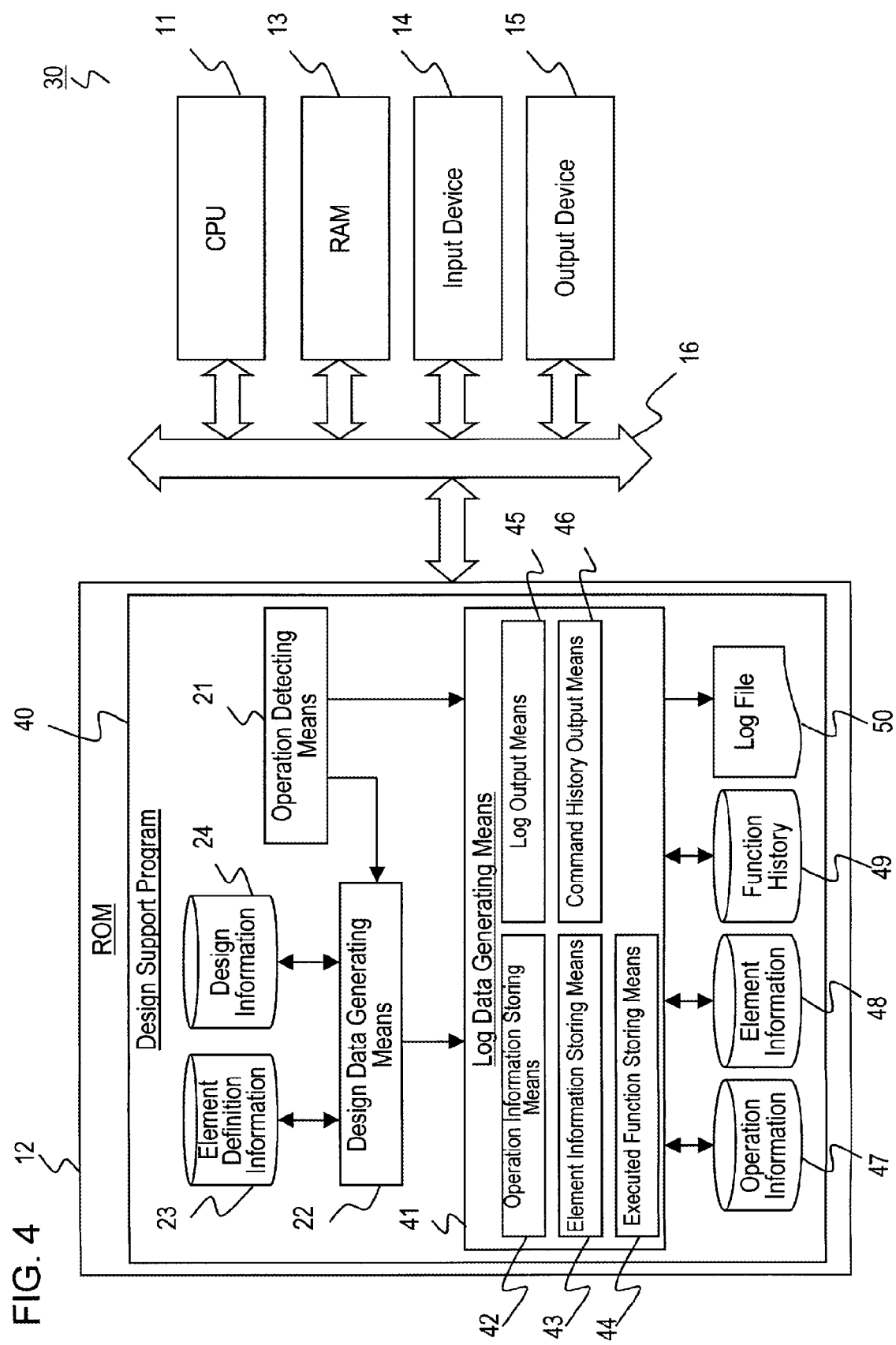
FIG. 4 is a view illustrating a configuration of a design support apparatus for a circuit board in the present embodiment.

FIG. 4 is a view illustrating a configuration of a design support apparatus for a circuit board in the present embodiment. In FIG. 4, the parts common to those of the design support apparatus 10 in FIG. 1 are designated by the same reference numerals. A design support apparatus 30 of FIG. 4 has the CPU 11, the ROM 12, the RAM 13, the input device 14 such as a mouse and a keyboard, an output device 15 such as a display, and a bus 16. The CPU 11 executes a design support program 40 stored in the ROM 12 to implement the operation detecting means 21, the design data generating means 22, and a log data generating means 41.

The log data generating means 41 includes an operation information storing means 42 for storing the operation information detected by the operation detecting means 21 after the activation of the design support program in an operation information table 47 (operation information storage section), an element information storing means 43 for storing a target element on which a command is executed in an element information table 48 (element information storage section), an executed function storing means 44 for storing the history of the program function executed after the activation of the design support program in a function history table 49 (function history storage section), a log output means 45 for outputting, upon detection of an abnormal end by the design data generating means 22, the operation information table 47, the element information table 48, and the function history table 49 to a log file 50, and a command history output means 46 for outputting the name of the executed command to the log file 50.

When activating the design support program 40 in response to the operation of the input device 14 by the designer, the CPU 11 displays the screen 100 of FIG. 2 on the display of the output device 15. The designer operates the input device 14 to execute the command via the screen 100 and produce the design data.

Figure 5:
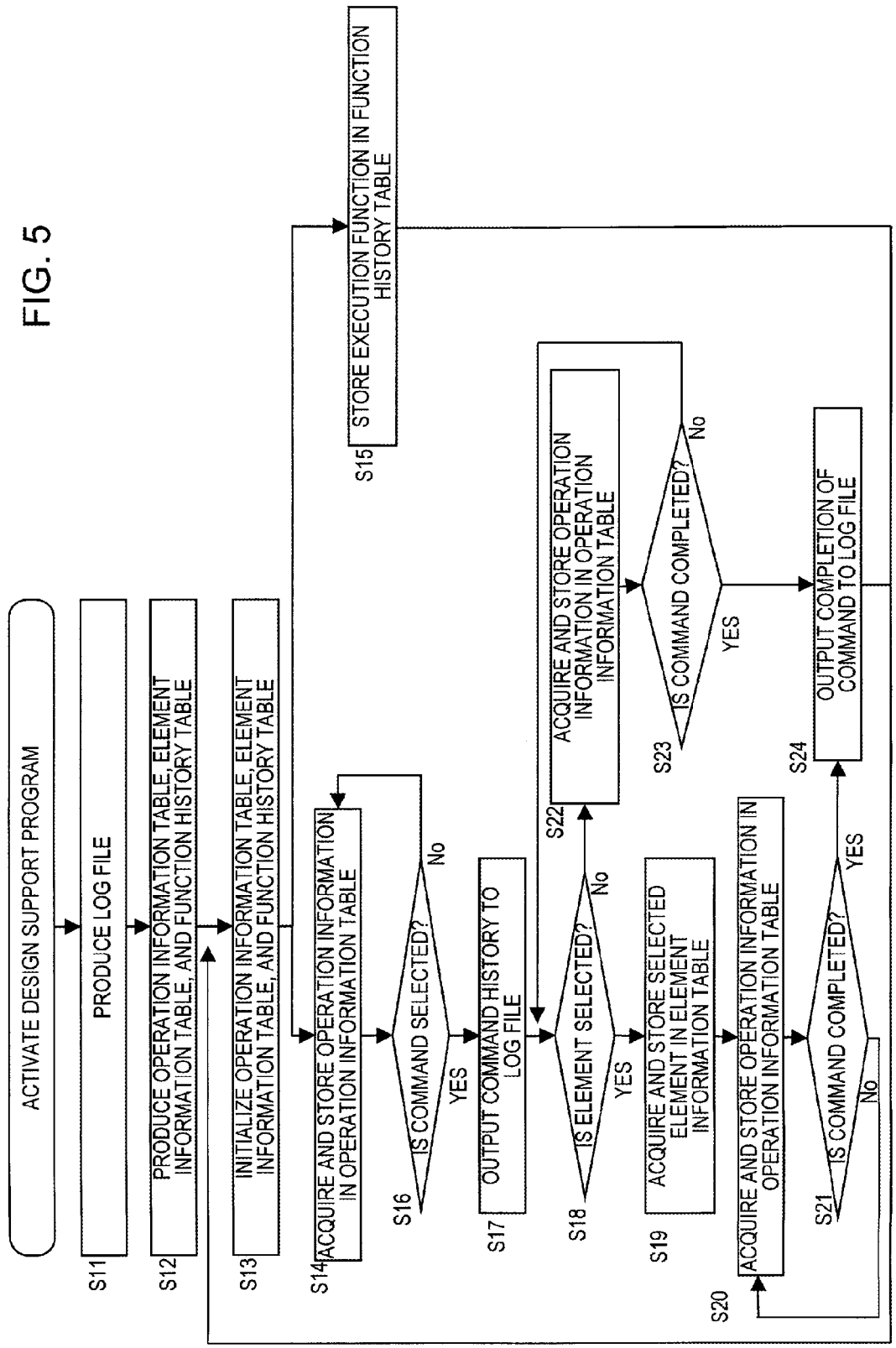
FIG. 5 is a log data generation flow chart during the normal operation of the design support program in the present embodiment.

FIG. 5 is a log data generation flow chart during the normal operation of the design support program in the present embodiment.

Upon activation of the design support program 40, the log data generating means 41 generates the log file 50 (S11). At this time, into the log file 50, no history has been output. Next, the log data generating means 41 generates the operation information table 47, the element information table 48, and the function history table 49 (S12) and performs initialization (initializing Step S13).

Then, the log data generating means 41 acquires the operation information detected by the operation detecting means 21 and starts to store the operation information in the operation information table 47 (operation information storing Step S14). At the same time, the log data generating means 41 starts to store the history of the executed program function in the function history table 49 (executed function storing Step S15). Note that the storage of the history of the program function (S15) is performed till the notification of the completion of the execution of the command is output to the log file (S24).

When the operation information stored in Step S14 is not the selection of a command (No in S16), the data generating means 41 returns to Step S14, acquires the operation information detected next by the operation detecting means 21, and stores the operation information in the operation information table 47 (S14).

On the other hand, when the operation information stored in Step S14 is the selection of a command (YES in S16), the log data generating means 41 outputs the name of the selected command to the log file (S17). Then, after Step S17, the log data generating means 41 determines whether or not the target element on which the command is executed is selected (S18). This is because, as will be described later, in the design support program 40, there are the cases where the command is selected after the selection of the element is performed and where the element is selected after the command is selected and then one or a plurality of operations are performed.

When the target element on which the command is executed is selected in Step S18 (YES in S18), the log data generating means 41 stores the selected element in the element information table 48 (element information storing Step S19). Then, the data generating means 41 acquires the operation information detected next by the operation detecting means 21 and stores the operation information in the operation information table 47 (operation information storing Step S20).

After Step S20, the log data generating means 41 determines whether or not the operation information in Step S20 indicates an operation of completing the command (S21). In Step S21, when the operation information in Step S20 does not indicate the operation of completing the command (No in S21), the log data generating means 41 returns to Step S20. On the other hand, when the operation information in Step S20 indicates the operation of completing the command (Yes in S21), the log data generating means 41 outputs the notification of the completion of the command to the log file (log output Step S24). After Step S24, the log data generating means 41 returns to Step S13 and initializes the operation information table 47, the element information table 48, and the function history table 49 (S13).

In Step S18, when the target element on which the command is executed is not selected (No in S18), the element may possibly be selected by the next operation by the designer. Accordingly, the data generating means 41 acquires the operation information detected next by the operation detecting means 21 and stores the operation information in the operation information table 47 (operation information storing Step S22).

After Step S22, the log data generating means 41 determines whether or not the operation information in Step S22 indicates the operation of completing the command (S23). When the operation information in Step S22 does not indicate the operation of completing the command (No in S23), the log data generating means 41 returns to Step S18 and determines whether or not the element is selected (S18). On the other hand, when the operation information in Step S22 indicates the operation of completing the command (Yes in S23), i.e., when the operation of completing the command is performed without selecting the element, the log data generating means 41 outputs the notification of the completion of the command to the log file (S24). After Step S24, the log data generating means 41 returns to Step S13 and initializes the operation information table 47, the element information table 48, and the function history table 49 (S13).

Thus, during the normal operation of the design support program, the log data generating means 41 stores the operation information, the selected elements, and the history of the program functions during the period after the activation of the design support program 40 or after the completion of the execution of the previous command and before the completion of the execution of the current command, in the operation information table 47, the element information table 48, and the function history table 49, respectively. When the normal operation, the operation information, the elements, and the history of the executed program functions are not needed so that the log data generating means 41 deletes the tables and does not output these items to the log file 50.

Figure 6:
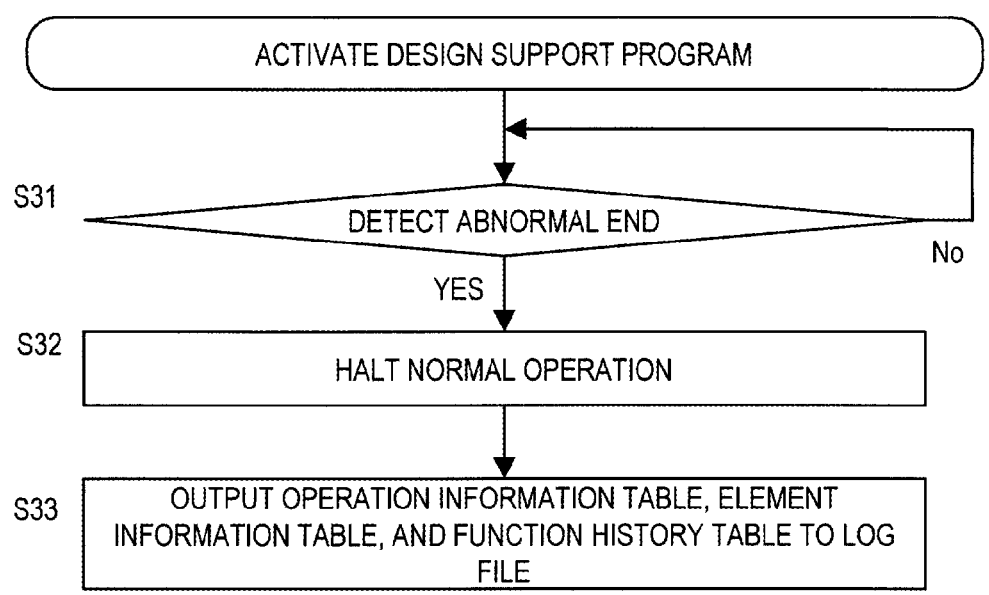
FIG. 6 is a flow chart of log data generation at the abnormal end of the design support program in the present embodiment.

FIG. 6 is a flow chart of log data generation at the abnormal end of the design support program in the present embodiment.

Upon activation of the design support program 40, it is determined in the design data generating means 22 whether or not an abnormal end occurred (S31). When the design data generating means 22 detects the abnormal end, the log data generating means 41 responds thereto (YES in S31) and halts the normal operation in FIG. 5 (S32). Then, the log data generating means 41 outputs the operation information table 47, the element information table 48, and the function history table 49 at that time to the log file 50 (S33).

Consequently, to the log file 50, the operation information stored in the operation information table 47 during the period after the activation of the design support program 40 or after the completion of the execution of the previous command and before the abnormal end, the elements stored in the element information table 48 during the period, and the function history stored in the function history table 49 during the period are output. This allows the developer to obtain only information needed to analyze the cause of the abnormal end.

In the following first to fourth embodiments, a description will be given below of specific examples of the operation of the design support program 40.

(First Embodiment)

In the first embodiment, a description will be given of the operation of the design support program 40 when the designer has performed an operation of changing an attribute of the component placed in the design diagram display section 104. First, a description will be given of an example during the normal operation of the design support program 40.

Figure 7:
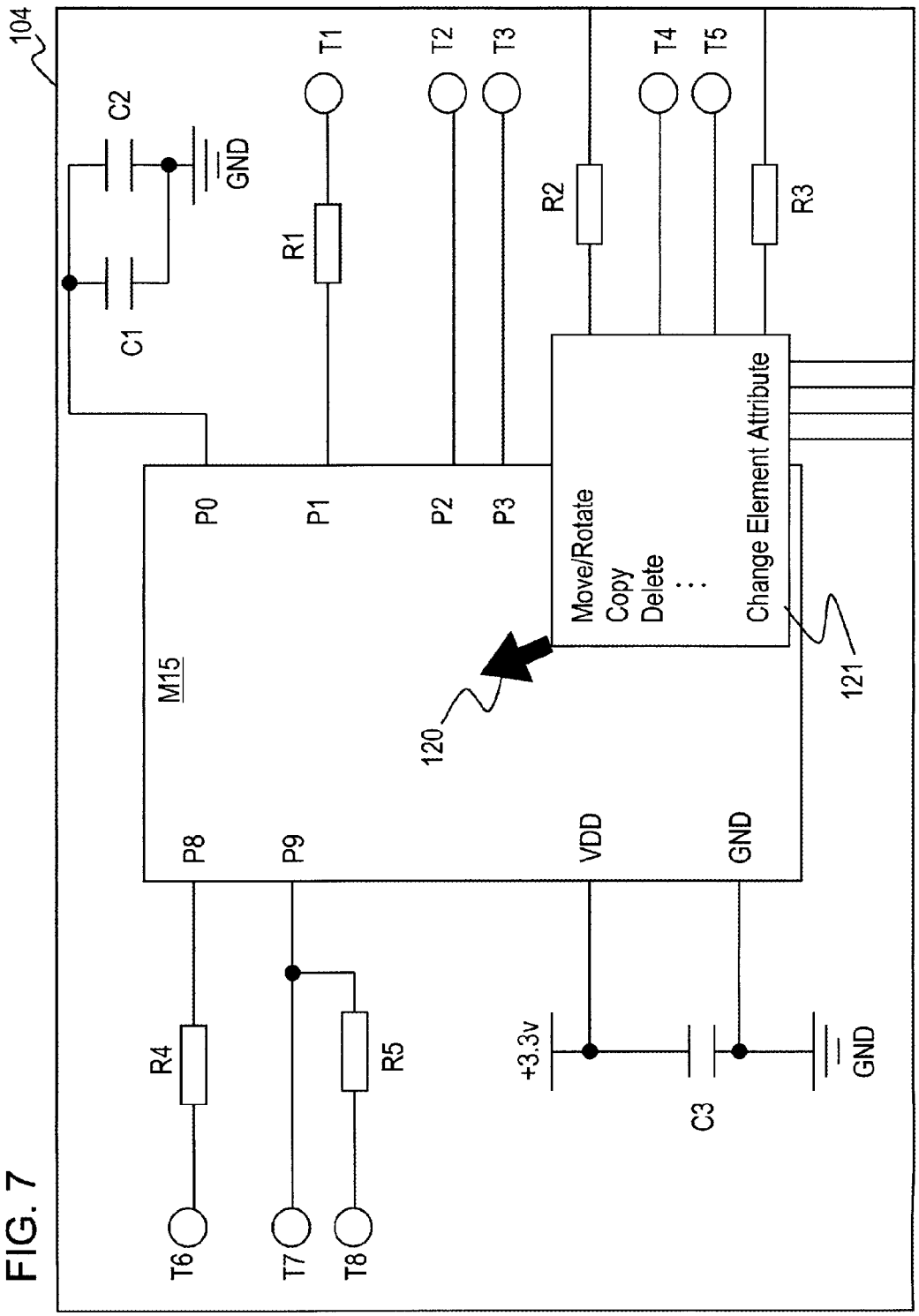
FIG. 7 is a view illustrating a first example of the design diagram display section in the first embodiment.

FIG. 7 is a view illustrating a first example of the design diagram display section in the first embodiment. FIG. 7 illustrates an example of the design diagram display section 104 of the screen 100 displayed on the output device 15 while the designer is producing the design data.

In the design diagram display section 104 of FIG. 7, pins P1 to P8, an integrated circuit M15 having VDD and GND, capacitors C1 to C3, resistors R1 to R5, a reference power source GND, a 3.3 v power source, signal couplers T1 to T8, and linear signal lines connecting the individual elements are placed. In FIG. 7, to change the name "M15" of the integrated circuit M15 to "M16", the designer moves the mouse of the input device 14 first to move a cursor 120 onto the integrated circuit M15 and presses the left click of the mouse to select the integrated circuit M15. At this time, the log data generating means 41 acquires operation information about the movement of the mouse and the pressing of the left click each performed by the designer from the operation detecting means 21 and stores the operation information in the operation information table 47 (Step S14 of FIG. 5). At the same time, the log data generating means 41 stores the history of the program function executed in response to the operation by the designer in the function history table 49 (Step S15 of FIG. 5).

Next, the designer presses the right click of the mouse to display a pop-up menu 121. At this time, the log data generating means 41 acquires operation information about the pressing of the right click from the operation detecting means 21 and stores the operation information in the operation information table 47 (Step S14 of FIG. 5). At the same time, the log data generating means 41 stores the history of the program function executed in response to the operation by the designer in the function history table 49 (Step S15 of FIG. 5).

Then, the designer moves the mouse to move the cursor 120 onto the "Change Element Attribute" displayed in the pop-up menu 121 and presses the left click of the mouse to select the "Change Element Attribute" command. As a result, the "Change Element Attribute" command is started.

At this time, the log data generating means 41 acquires operation information that, by the pressing of the left click, "Change Element Attribute" command is selected from the operation detecting means 21 and stores the operation information in the operation information table 47 (Step S14 of FIG. 5). At the same time, the log data generating means 41 stores the history of the program function executed in response to the operation by the designer in the function history table 49 (Step S15 of FIG. 5). Since the operation information corresponds to the selection of the command (YES in Step S16 of FIG. 5), the selected "Change Element Attribute" command is output to the log file 50 (Step S17 of FIG. 5). Since the integrated circuit M15 is selected in advance (YES in Step S18 of FIG. 5), the log data generating means 41 stores the integrated circuit M15 in the element information table 48 (Step S19 of FIG. 5).

FIG. 8 is a view illustrating an example of the operation information table, the element information table, the function history table, and the log file when the "Change Element Attribute" command is selected in the first embodiment. FIG. 8 illustrates the operation information table 47, the element information table 48, the function history table 49, and the log file 50 when the operation in FIG. 7 is performed.

In the operation information table 47 of FIG. 8, as described above, operation information about the operation of selecting the integrated circuit M15, the operation of displaying the pop-up menu 121, and the operation of selecting the "Change Element Attribute" command is stored. The operation information table 47 stores, for each of the operations, "Design Data Name", "Main Screen Name", "Sub-Screen Name", "Operated Input Device 14", "Content of Operation (Coordinate, Name of Button Displayed on Screen, Input Character, and Command Name)", and "Content of Operation Performed by Designer on Input Device 14 (Left/Right Click or Keyboard Button)" as operation information. For example, the operation information "Design Diagram 01, Screen 100, Mouse, x: 265 mm and y: 215 mm, and Left Click" in the first row in the operation information table 47 indicates the operation of selecting the integrated circuit M15. That is, the first row indicates that the designer pressed the left click of the mouse at the coordinate "x: 265 mm and y: 215 mm" on the screen 100. Likewise, the operation information "Design Diagram 01, Screen 100, Mouse, x: 265 mm and y: 215 mm, and Right Click" in the second row indicates the operation of displaying the pop-up menu 121, and the operation information "Design Diagram 01, Screen 100, Pop-Up Menu, Mouse, Command (Change Element Attribute), and Left Click" in the third row indicates the operation of selecting the "Change Element Attribute" command.

On the other hand, in the element information table 48 of FIG. 8, the component (M15) is registered by the operation of selecting the "Change Element Attribute" command.

In the function history table 49 of FIG. 8, the program functions executed by the operation of selecting the integrated circuit M15, the operation of displaying the pop-up menu 121, and the operation of selecting the "Change Element Attribute" command are stored in an ascending order. The uppermost first row of the function history table 49 indicates that a program function "Cclass" in a module "MeBP.exe" present in the path "C:¥ Programfiles¥ BP" is executed.

In a command history section 141 of the log file 50 of FIG. 8, the command name "Change Element Attribute" has been output from the log data generating means 41 to the lower-most row as a result of the operation of selecting the "Change Element Attribute" command (Step S17 of FIG. 5). Note that, to the rows above the "Change Element Attribute", the names of the commands executed by the designer prior to the operation in FIG. 7 and the notifications of the completion of the commands have been output.

FIGS. 9A and 9B are views each illustrating an example of an element attribute changing operation in the first embodiment. When the designer selects the "Change Element Attribute" command in FIG. 7, an element-attribute change screen 130 illustrated in each of FIGS. 9A and 9B is displayed on the output device 15. As illustrated in FIG. 9A, the designer operates the mouse to move the cursor 120 onto a component name space 131 and presses the left click to select the component name space 131. Then, the designer deletes "M15" written in the component name space 131 and inputs "M16" using the keyboard. At this time, the log data generating means 41 acquires operation information thereabout from the operation detecting means 21 and stores the operation information in the operation information table 47 (Step S20 of FIG. 5). At the same time, the log data generating means 41 stores the history of the program functions executed in response to the operations by the designer in the function history table 49 (Step S15 of FIG. 5).

Then, as illustrated in FIG. 9B, the designer operates the mouse to move the cursor 120 onto a complete button 132 and presses the left click to complete the "Change Element Attribute" command. At this time, the log data generating means 41 acquires operation information about the operation of completing the "Change Element Attribute" command from the operation detecting means 21 and stores the operation information in the operation information table 47 (Step S20 of FIG. 5). At the same time, the log data generating means 41 stores the history of the program function executed in response to the operation of completing the "Change Element Attribute" command in the function history table 49 (Step S15 of FIG. 5). In addition, since the operation performed by the designer is the operation of completing the "Change Element Attribute" command (YES in S21 of FIG. 5), the log data generating means 41 outputs the notification of the completion of the command to the log file (S24 of FIG. 5). After Step S24, the log data generating means 41 returns to Step S13 and initializes the operation information table 47, the element information table 48, and the function history table 49 (S13 of FIG. 5).

FIG. 10 is a view illustrating an example of the operation information table, the element information table, the function history table, and the log file at the completion of the "Change Element Attribute" command in the first embodiment. FIG. 10 illustrates the operation information table 47, the element information table 48, the function history table 49, and the log file 50 when the operation of completing the "Change Element Attribute" command in FIG. 9 is performed and the log data generating means 41 outputs the notification of the completion of the command to the log file (Step S24 of FIG. 5).

In the operation information table 47 of FIG. 10, operation information about operations after the operation of selecting the "Change Element Attribute" command described in FIG. 9, i.e., the operation of selecting the component name space 131, the operation of deleting "M15" written in the component name space 131, the operation of inputting "M16" to the component name space 131, and the operation of completing the "Change Element Attribute" command is stored in the fourth to eleventh rows. Note that the operation information in the first to third rows is the same as in FIG. 8.

The operation information "Design Diagram 01, Element-Information Change 130, Component Information, Mouse, Component Name, and Left Click" in the fourth row indicates the operation of selecting the component name space 131. The operation information "Design Diagram 01, Element-Information Change 130, Component Information, Keyboard, and Delete" in the fifth to seventh rows indicates the operation of deleting "M15" written in the component name space 131. Also, the operation information "Design Diagram 01, Element-Information Change 130, Component Information, Keyboard, and M", "Design Diagram 01, Element-Information Change 130, Component Information, Keyboard, and 1", and "Design Diagram 01, Element-Information Change 130, Component Information, Keyboard, and 6" in the eighth to tenth rows indicates the operation of inputting "M16" to the component name space 131. The operation information "Design Diagram 01, Element-Attribute Change 130, Component Information, Mouse, OK, and Left Click" in the eleventh row indicates the operation of completing the "Change Element Attribute" command.

In the element information table 48 of FIG. 10, in the same manner as in FIG. 8, the "Component (M15)" stored in the element information table 48 upon selection of the "Change Element Attribute" command is stored.

In the function history table 49 of FIG. 10, the program functions executed subsequently to FIG. 8 are further stored. In the function history table 49 of FIG. 10, the history including and below the first row in FIG. 8 corresponds to the history including and below the third row in FIG. 10. Also, the function history table 49 of FIG. 10 indicates that, subsequently to FIG. 8, a program function "Function" in the module "MeBP.exe" present in the path "C:¥ Programfiles¥ BP" which has been output to the second row was executed, and a program function "SetUndo" in the module "MeBP.exe" present in the path "C:¥ Programfiles¥ BP" which has been output to the first row was executed.

In the command history section 141 of the log file 50 of FIG. 10, "Completion of Element Attribute Change" notifying that the command was completed has been output to the row under the command name "Change Element Attribute" (S24 of FIG. 5). When the log data generating means 41 performs the initializing operation (S13 of FIG. 5) after outputting the notification of the completion of the command to the log file (S24 of FIG. 5), the operation information, the elements, and the history of the program functions which have been stored in the respective tables 47 to 49 of FIG. 10 are all deleted.

Thus, in the normal operation, the log data generating means 41 stores the operation information during the period after the completion of the execution of the previous command and before the completion of the execution of the current "Change Element Information" command in the operation information table 47, stores the element selected during the period in the element information table 48, and stores the functions executed during the period in the function history table 49. When the execution of the "Change Element Information" command is completed, the operation information, the elements, and the history of the executed program functions are no longer needed, and therefore the log data generating means 41 deletes and does not output these items to the log file 50.

Next, a description will be given of an example at the abnormal end of the design support program 40.

FIG. 11 illustrates an example of the log file which is output at the abnormal end in the first embodiment. For example, it is assumed that the design support program 40 was abnormally ended when, in, e.g., FIG. 9, the designer input an environment dependent character "I", not "M16", to the component name space 131, operated the mouse to move the cursor 120 onto the complete button 132, and pressed the left click (YES in Step S31 of FIG. 6). In this case, the log data generating means 41 halts the operation in FIG. 5 (Step S32 of FIG. 6) and outputs the operation information table 47, the element information table 48, and the function history table 49 to the log file 50, as illustrated in FIG. 11.

The command history section 141 of the log file 50 in FIG. 11 is the same as in FIG. 8. To the operation information section 142, the operation information stored in the operation information table 47 by the time the log data generating means 41 halts the normal operation due to the abnormal end (Step S32 of FIG. 6) is output (Step S33 of FIG. 6). The operation information in the eighth row has been garbled since the character input from the keyboard is the environment dependent character. To the element information section 143, the elements stored in the element information table 48 by the time the log data generating means 41 halts the operation due to the abnormal end (Step S32 of FIG. 6) are output (Step S33 of FIG. 6). To the function history section 144, the program functions stored in the function history table 49 by the time the data generating means 41 halts the operation due to the abnormal end (Step S32 of FIG. 6) are output (Step S33 of FIG. 6).

Upon receipt of an inquiry from the designer, the developer recognizes from the log file 50 of FIG. 11 that, on the component (M15) (the first row in the element information section 143), the "Change Element Attribute" command was first executed (the third row in the operation information section 142).

Next, the developer recognizes that the item "Component Name" in the component information on the element-attribute change screen 130 was selected (the fourth row in the operation information 142) and the "1" button, the "Convert" button, and the Enter button were successively pressed to input the environment dependent character "I" (the eighth to tenth rows in the operation information 142).

Then, the developer recognizes that the abnormal end occurred when the operation of pressing the right click of the mouse was performed on the OK button displayed on the component information screen of the element-attribute change screen 130 (the eleventh row in the operation information section 142).

Further, based on the function history section 144, the developer recognizes that the abnormal end occurred during the execution of the program function "Function" in the module "MeBP.exe" present in the path "C:¥ Programfiles¥ BP".

Then, the developer promptly responds to the abnormal end by receiving the design data "Design Diagram 01" being produced from the designer and performing the same operation as that performed by the designer based on the log file 50, debugging the program function "Function", or the like.

As a result, the developer finds the cause of the abnormal end which occurred for such a reason that, when, e.g., a character other than the predetermined inputtable characters was input, processing for outputting a warning message was not defined in the program function "Function" and the operation of causing the design support apparatus 30 to perform processing incompatible with the program function "Function" was performed.

When the abnormal end thus occurred, the log data generating means 41 halts the normal operation and outputs the operation information table 47, the element information table 48, and the function history table 49 at that time to the log file 50. This allows the developer to recognize the situation at the abnormal end based on the log file 50 and promptly respond to the abnormal end.

(Second Embodiment)

In the second embodiment, a description will be given of the operation of the design support program 40 when the designer performs an operation of moving a plurality of elements to arbitrary coordinates.

Figure 12:
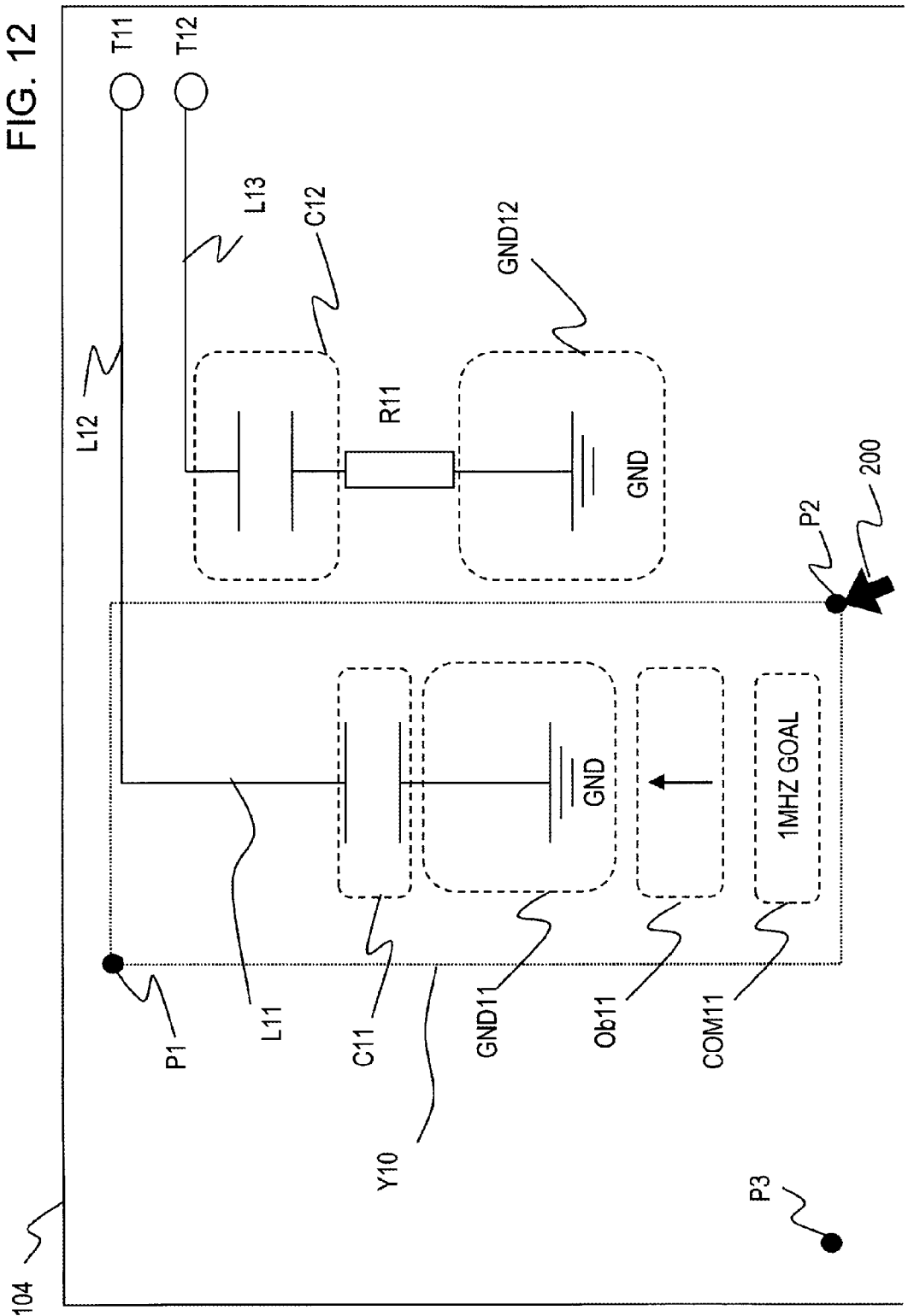
FIG. 12 is a view illustrating a first example of the design diagram display section in the second embodiment.

FIG. 12 is a view illustrating a first example of the design diagram display section in the second embodiment. FIG. 12 illustrates an example of the design diagram display section 104 of the screen 100 displayed on the output device 15 while the designer is producing design data.

In the design diagram display section 104 of FIG. 12, signal lines L11 to L13, the capacitors C11 and C12, ground power sources GND11 and GND12, a resistor R12, a figure Ob11 of an arrow, a text COM11, and signal couplers T11 and T12 are placed.

In the second embodiment, in the state of placement in FIG. 12, the designer performs the operation of selecting the signal line L11, the capacitor C11, the ground power source GND11, the figure Ob11, and the character string COM11 (hereinafter referred to as an element group Y10) and moving the selected elements. First, a description will be given of an example during the normal operation of the design support program 40.

The designer moves the mouse of the input device 14 to move a cursor 200 to a coordinate P1 (x: 120 mm and y: 240 mm). Then, the designer moves the mouse, while pressing the left click of the mouse, to move the cursor 200 to a coordinate P2 (x: 200 mm and y: 100 mm) and stops pressing the left click of the mouse. As a result, the element group Y10 is selected.

At this time, the log data generating means 41 acquires operation information about the movement of the mouse while the left click was being pressed by the designer and stores the operation information in the operation information table 47 (Step S14 of FIG. 5). At the same time, the log data generating means 41 stores the history of the program function executed in response to the operation by the designer in the function history table 49 (Step S15 of FIG. 5).

Figure 13:
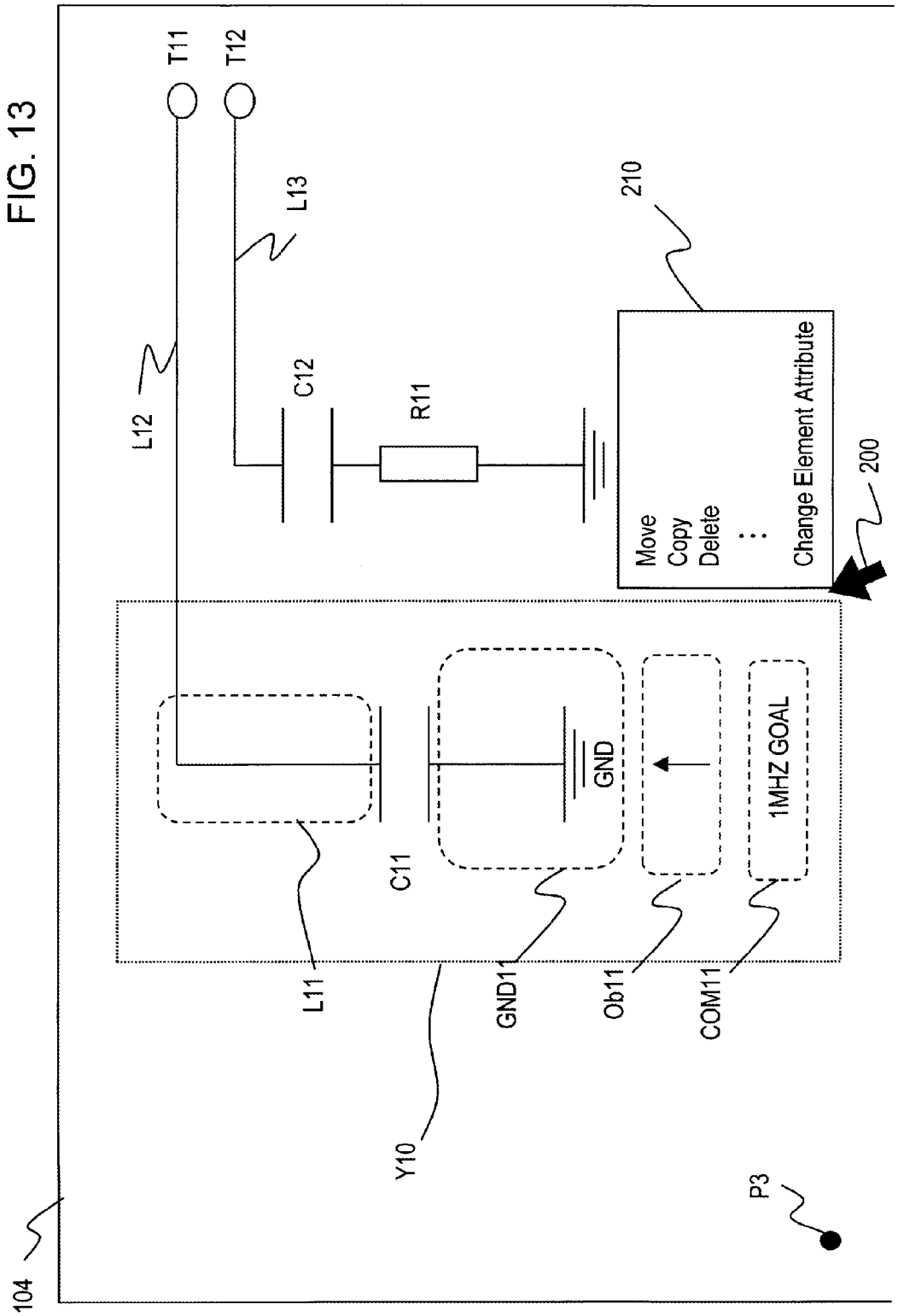
FIG. 13 is a view illustrating a second example of the design diagram display section in the second embodiment.

FIG. 13 is a view illustrating a second example of the design diagram display section in the second embodiment. After selecting the elements, the designer presses the right click of the mouse of the input device 14 to display a pop-up menu 210.

At this time, the log data generating means 41 acquires operation information about the pressing of the right click from the operation detecting means 21 and stores the operation information in the operation information table 47 (Step S14 of FIG. 5). At the same time, the log data generating means 41 stores the history of the program function executed in response to the operation by the designer in the function history table 49 (Step S15 of FIG. 5).

Then, the designer moves the mouse to move the cursor 200 onto the "Move" which is among the commands displayed in the pop-up menu 210 and presses the left click of the mouse to select the "Move" command. As a result, the "Move" command is started.

At this time, the log data generating means 41 acquires operation information that the "Move" command is selected by the pressing of the left click from the operation detecting means 21 and stores the operation information in the operation information table 47 (Step S14 of FIG. 5). At the same time, the log data generating means 41 stores the history of the program function executed in response to the operation by the designer in the function history table 49 (Step S15 of FIG. 5). Since the operation information corresponds to the selection of the command (YES in Step S16 of FIG. 5), the selected "Move" command is output to the log file 50 (Step S17 of FIG. 5).

Since the element group Y10 has been selected in advance (YES in Step S18 of FIG. 5), the log data generating means 41 stores the signal line L11, the capacitor C11, the ground power source GND11, the figure Ob11, and the character string COM11 in the element information table 48 (Step S19 of FIG. 5).

Figure 14:
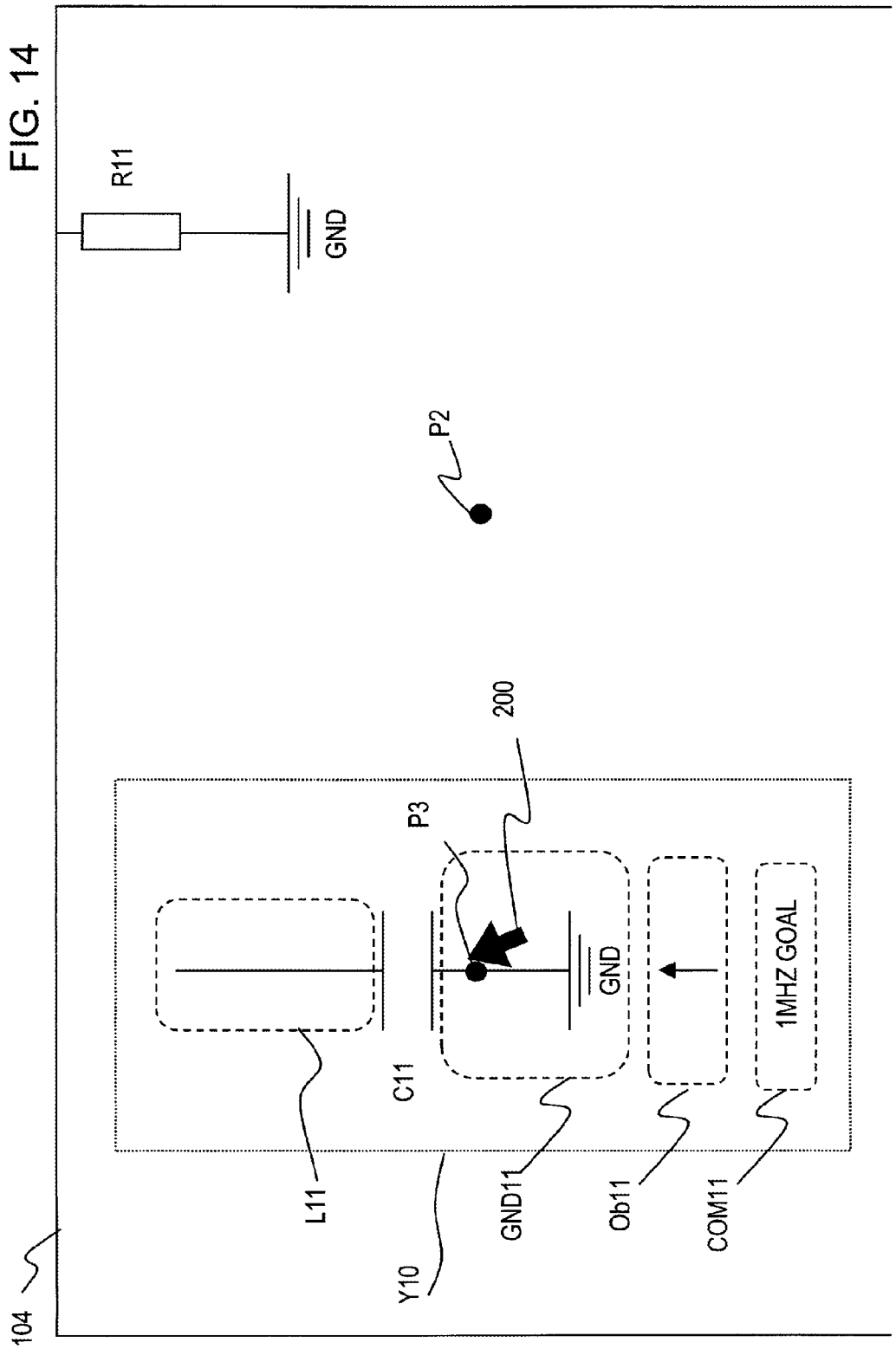
FIG. 14 is a view illustrating a third example of the design diagram display section in the second embodiment.

FIG. 14 is a view illustrating a third example of the design diagram display section in the second embodiment. After selecting the "Move" command, the designer moves the mouse to move the cursor from the coordinate P2 to a coordinate P3 (x: 50 mm and y: 100 mm). Then, the designer presses the left click of the mouse on the coordinate P3. As a result, the element group Y10 moves to a position centered on the coordinate P3. That is, the signal line L11, the capacitor C11, the ground power source GND11, the figure Ob11, and the character string COM11 are moved. In the "Move" command, the completion of the movement of the elements results in the completion of the "Move" command. Therefore, when the movement of the elements Y10 is completed by the operation of pressing the left click of the mouse on the coordinate P3, the "Move" command is completed.

At this time, the log data generating means 41 acquires operation information about the pressing of the left click on the coordinate P3 from the operation detecting means 21 and stores the operation information in the operation information table 47 (Step S20 of FIG. 5). At the same time, the log data generating means 41 stores the history of the program function executed in response to the operation by the designer in the function history table 49 (Step S15 of FIG. 5). In addition, since the operation performed by the designer is the operation of completing the "Move" command (YES in S21 of FIG. 5), the log data generating means 41 outputs the notification of the completion of the command to the log file (S24 of FIG. 5). Moreover, since the operation of pressing the left click on the coordinate P3 corresponds also to the operation of completing the "Move" command (YES in S21 of FIG. 5), the log data generating means 41 outputs the notification of the completion of the command to the log file (S24 of FIG. 5). After Step S24, the log data generating means 41 returns to Step S13 and initializes the operation information table 47, the element information table 48, and the function history table 49 (S13 of FIG. 5).

Figure 15:
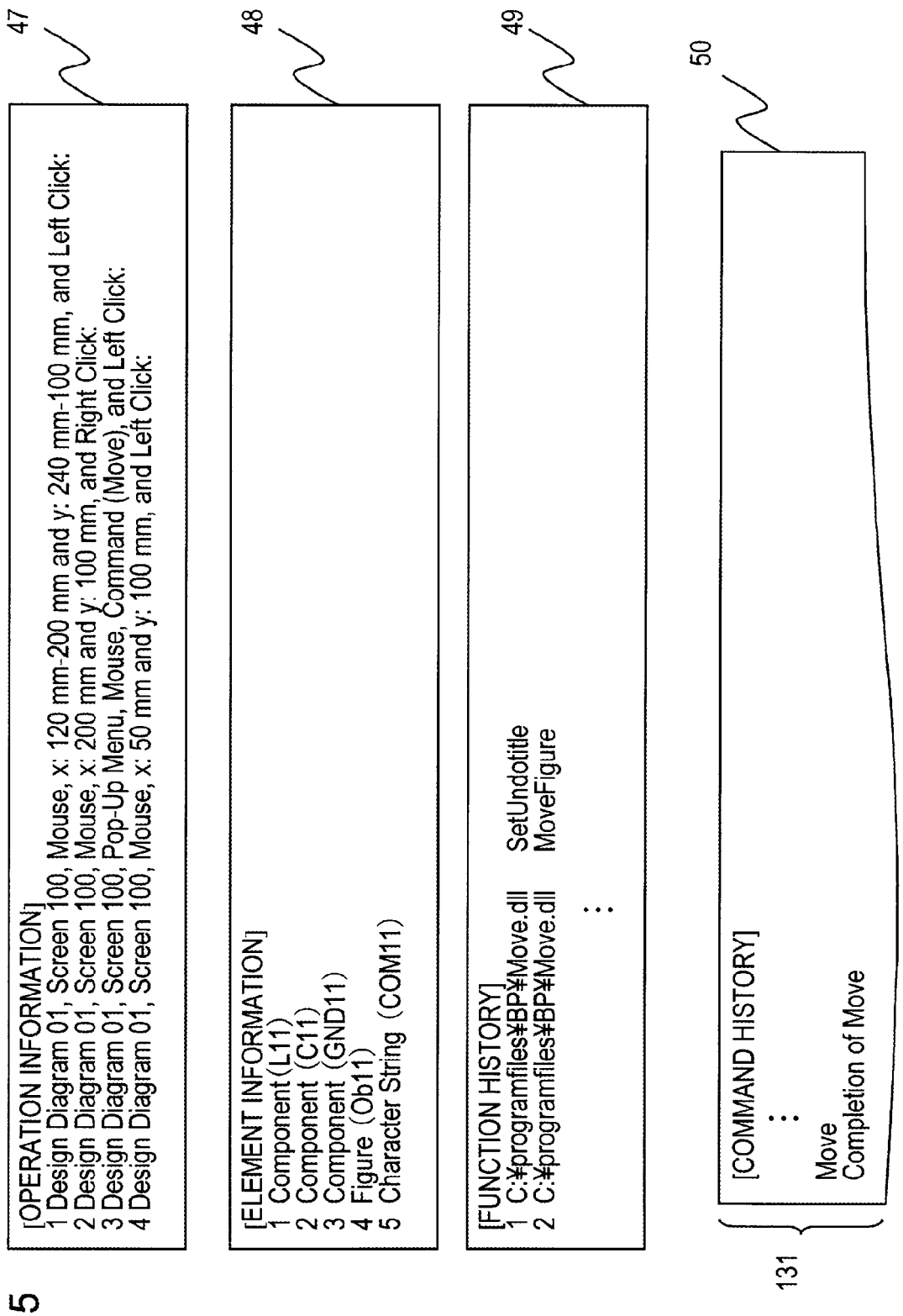
FIG. 15 is a view illustrating an example of the operation information table, the element information table, the function history table, and the log file at the completion of the "Move" command in the second embodiment.

FIG. 15 is a view illustrating an example of the operation information table, the element information table, the function history table, and the log file at the completion of the "Move" command in the second embodiment. FIG. 15 illustrates the operation information table 47, the element information table 48, the function history table 49, and the log file 50 when the log data generating means 41 has output the log file indicating the completion of the "Move" command (S24 of FIG. 5).

In the operation information table 47 of FIG. 15, as illustrated in FIG. 12, the operation of moving the cursor from the coordinate P1 to the coordinate P2, while pressing the left click of the mouse, to select the element group Y10 is stored as the operation information "Design Diagram 01, Screen 100, Mouse, x: 120 mm-200 mm and y: 240 mm-100 mm, and Left Click" in the first row.

In the second row, the operation of pressing the left click of the mouse performed to display the pop-up menu on the coordinate P2 is stored as the operation information "Design Diagram 01, Screen 100, Mouse, x: 200 mm and y: 100 mm, and Right Click".

The operation information "Design Diagram 01, Screen 100, Pop-Up Menu, Mouse, Command (Move), and Left Click" in the third row indicates the operation of selecting the "Move" Command, as illustrated in FIG. 13.

The operation information "Design Diagram 01, Screen 100, Mouse, x: 50 mm and y: 100 mm, and Left Click" in the fourth row indicates the operation of pressing the left click of the mouse on the coordinate P3 to move the element group Y10, as illustrated in FIG. 14.

In the element information table 48 of FIG. 15, the "Component (Signal Line L11)", the "Component (Capacitor C11)", "Component (Ground Power Source GND11)", the "Figure Ob11", and the "Character String COM11" each stored in the element information table 48 upon selection of the "Move" command are stored.

In the function history table 49 of FIG. 15, the program functions executed in response to the operations by the designer in FIGS. 12 to 14 are stored in an ascending order. It is illustrated that, before a program function "SetUndotitle" in a module "Move.dll" present in the path "C:¥ Programfiles ¥ BP" in the uppermost first row was finally executed, a program function "MoveFigure" in the module "Move.dll" present in the path "C:¥ Programfiles ¥ BP" in the second row was executed.

In the command history section 141 of the log file 50 of FIG. 15, the "Completion of Element Attribute Change" indicating that the command was completed has been output to the row under the command name "Move" (S24 of FIG. 5). Note that, to the rows above the "Move", the names of the commands executed by the designer prior to the operation in FIG. 12 and the notifications of the completion of the commands have been output.

When the log data generating means 41 performs the initializing operation (S13 of FIG. 5) after outputting the notification of the completion of the "Move" command to the log file (S24 of FIG. 5), the operation information, the elements, and the history of the executed program functions which have been stored in the respective tables 47 to 49 of FIG. 15 are all deleted.

Thus, in the normal operation of the "Move" command, the log data generating means 41 stores the operation information during the period after the completion of the execution of the previous command and before the completion of the execution of the "Move" command in the operation information table 47, stores the selected elements in the element information table 48, and stores the executed functions in the function history table 49. When the execution of the "Move" command is completed, the operation information, the elements, and the history of the executed program functions are no longer needed, and therefore the log data generating means 41 deletes these items from the respective tables instead of outputting the items to the log file 50.

Next, a description will be given of an example at the abnormal end of the design support program 40.

FIG. 16 illustrates an example of the log file which is output at the abnormal end in the second embodiment. For example, it is assumed that the design support program 40 was abnormally ended when the designer selected the "Move" command in FIG. 13, then moved the cursor not onto the coordinate P3, but onto the coordinate (x: 220 mm and y: 140 mm) where the resistor R11 is placed in FIG. 14, and pressed the left click (YES in Step S31 of FIG. 6). In this case, the log data generating means 41 halts the operation in FIG. 5 (Step S32 of FIG. 6) and outputs the operation information table 47, the element information table 48, and the function history table 49 to the log file 50 (Step S33 of FIG. 6), as illustrated in FIG. 16.

In the command history section 141 of the log file 50 of FIG. 16, the command name "Move" output from the log data generating means 41 in response to the selection of the "Move" command has been output to the lowermost row (Step S17 of FIG. 5). In the operation information section 142, the operation information stored in the operation information table 47 by the time the log data generating means 41 halts the normal operation due to the abnormal end (Step S32 of FIG. 6) is output (Step S33 of FIG. 6). To the element information section 143, the elements stored in the element information table 48 by the time the log data generating means 41 halts the operation due to the abnormal end (Step S32 of FIG. 6) are output (Step S33 of FIG. 6). To the function history section 144, the program functions stored in the function history table 49 by the time the log data generating means 41 halts the operation due to the abnormal end (Step S32 of FIG. 6) are output (Step S33 of FIG. 6).

Upon receipt of an inquiry from the designer, the developer recognizes from the log file 50 of FIG. 16 that the abnormal end occurred when the "Move" command was executed on the signal line L11, the capacitor C11, the ground power source GND11, the figure Ob11, and the character string COM11 (the first to fifth rows in the element information section 143) and the operation of pressing the left click of the mouse was performed on the coordinate (x: 220 mm and y: 140 mm) where the resistor R11 was placed (the fourth row in the operation information section 142).

Further, the developer recognizes that the abnormal end occurred during the execution of the program function "MoveFigure" in the module "Move.dll" present in the path "C:¥ Programfiles¥ BP" based on the function history section 144.

Then, the developer promptly responds to the abnormal end by receiving the design data "Design Diagram 01" being produced from the designer and performing the same operation as that performed by the designer based on the log file 50, debugging the program function "MoveFigure", or the like.

As a result, the developer finds the cause of the abnormal end which occurred for such a reason that, when, e.g., a coordinate where an element was placed was selected, processing for outputting a warning message was not defined in the program function "MoveFigure" and the operation of causing the design support apparatus 30 to perform processing incompatible with the program function "MoveFigure" was performed.

When the abnormal end thus occurred, the log data generating means 41 halts the normal operation and outputs the operation information table 47, the element information table 48, and the function history table 49 at that time to the log file 50. This allows the developer to recognize the situation at the abnormal end based on the log file 50 and promptly respond to the abnormal end.

(Third Embodiment)

In the third embodiment, a description will be given to the operation of the design support program 40 when the placement of pins in an integrated circuit is changed.

Figure 17:
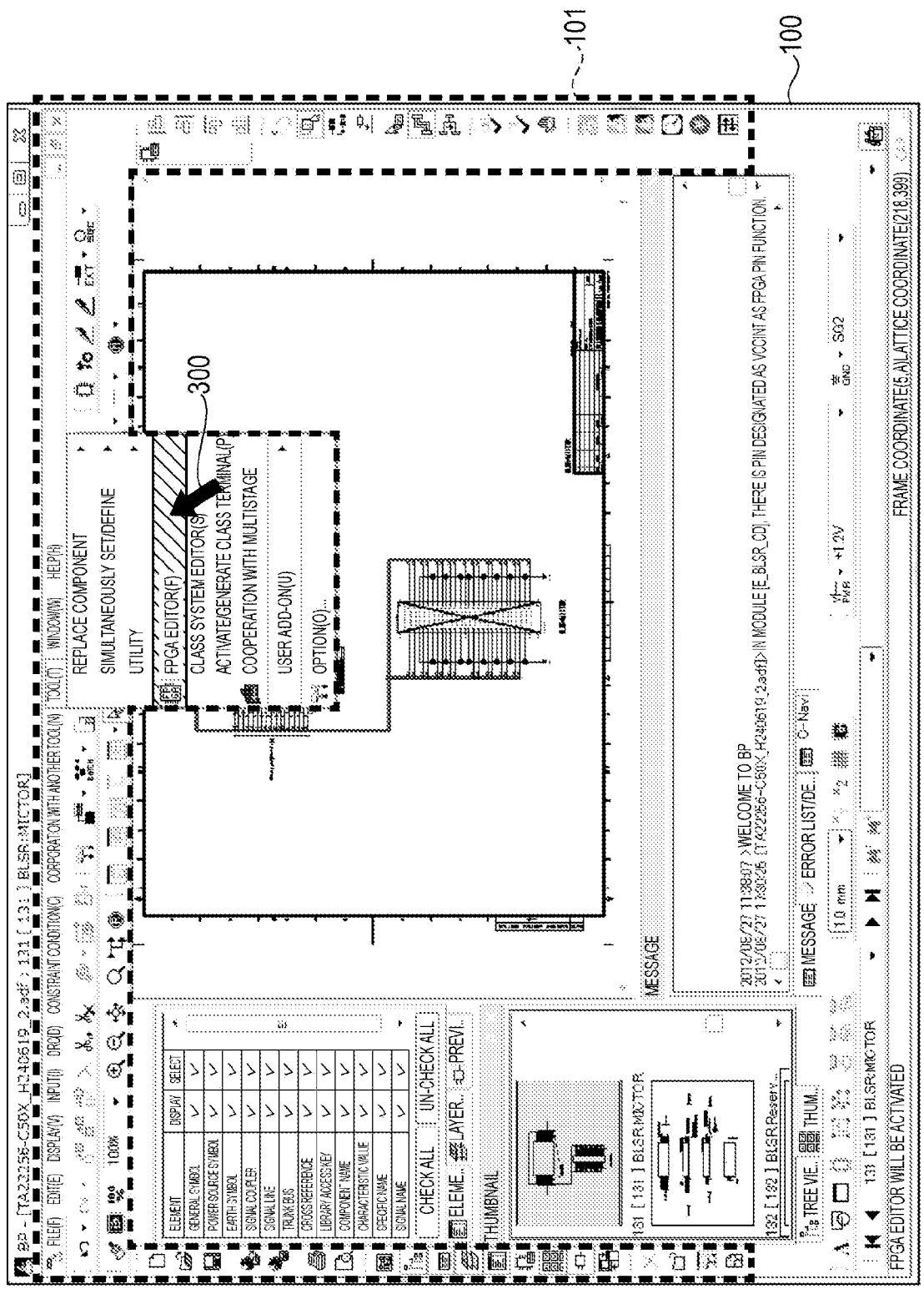
FIG. 17 is a view illustrating an example of a screen in the third embodiment.

FIG. 17 is a view illustrating an example of a screen in the third embodiment. FIG. 17 illustrates an example of the screen 100 displayed on the output device 15 while the designer is producing design data. The designer selects the "FPGA Editor" command which is for changing an attribute of an integrated circuit from the menu 101, reads a list of integrated circuits from the element information table to select an arbitrary integrated circuit therefrom, and changes the placement of pins in the selected integrated circuit. First, a description will be given of an example during the normal operation of the design support program 40.

In FIG. 17, the designer moves the mouse of the input device 14 to move a cursor 300 onto the "FPGA Editor" in the menu 101. Then, the designer presses the left click of the mouse to select the "FPGA Editor" command. As a result, the "FPGA Editor" command is started.

At this time, the log data generating means 41 acquires operation information that the "FPGA Editor" command is selected by the pressing of the left click from the operation detecting means 21 and stores the operation information in the operation information table 47 (Step S14 of FIG. 5). At the same time, the log data generating means 41 stores the history of the program function executed in response to the operation by the designer in the function history table 49 (Step S15 of FIG. 5). Since the operation information corresponds to the selection of the command (YES in Step S16 of FIG. 5), the selected "FPGA Editor" command is output to the log file 50 (Step S17 of FIG. 5). However, at this time, no element is selected (No in Step S18 of FIG. 5) so that no element is stored in the element information table 48.

Figure 18:
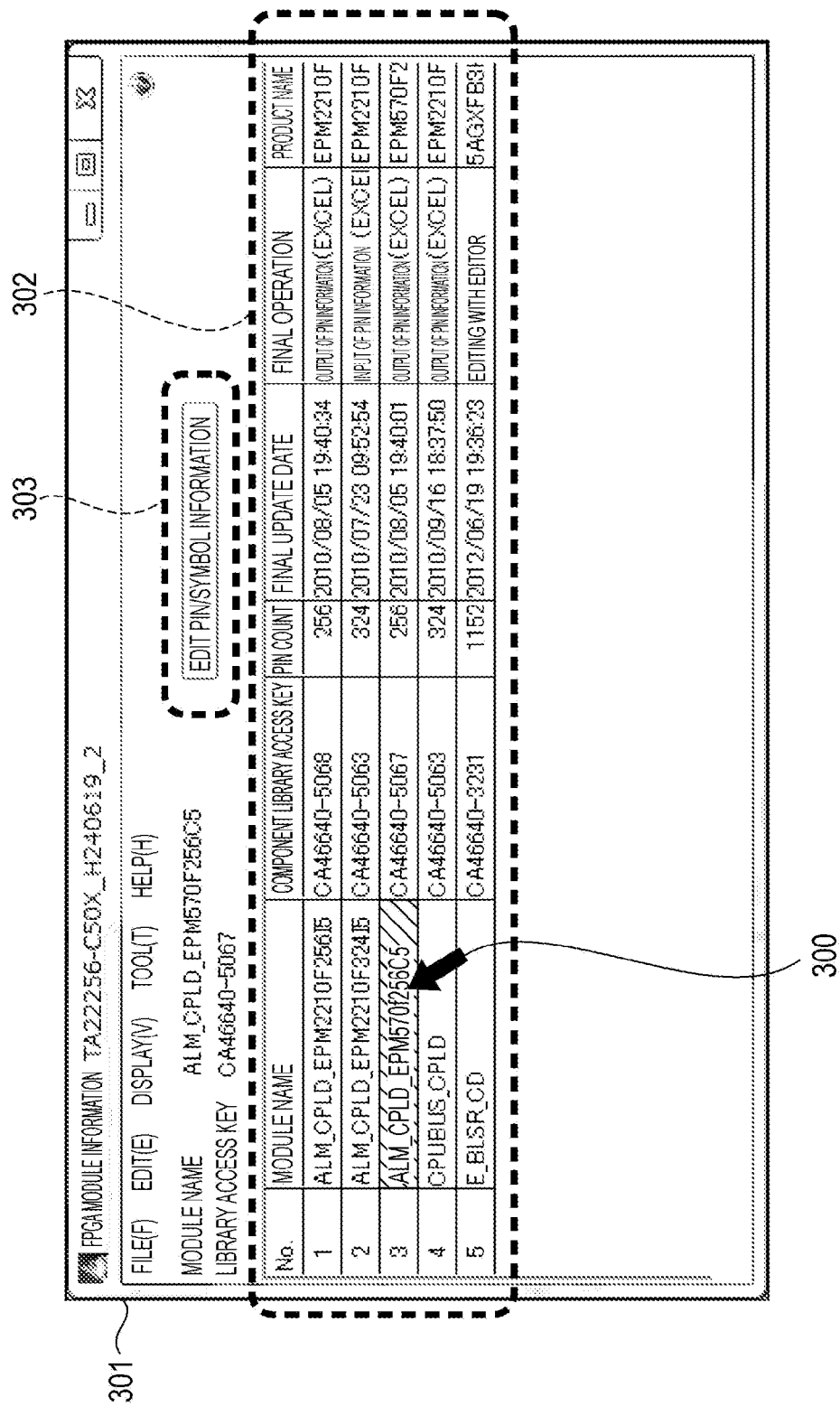
FIG. 18 is a view illustrating an example of the operation of changing an attribute of the integrated circuit in the fourth embodiment.

FIG. 18 is a view illustrating an example of the operation of changing an attribute of the integrated circuit in the third embodiment. When the designer selects the "FPGA Editor" command, an integrated-circuit-attribute change screen 301 in FIG. 18 is displayed on the output device 15. The integrated-circuit-attribute change screen 301 has a list 302 of the integrated circuits stored in the element information table 48, and a start edit button 303 for starting the editing of the integrated circuit selected from the list 302.

The designer selects the target integrated circuit to be edited from among the integrated circuits displayed in the list 302. In FIG. 18, the designer moves the mouse to move the cursor 300 onto the third row in the second "Module" column in the list 302 and presses the left click to select an integrated circuit "ALM_CPLD_EPM570F256C5".

At this time, the log data generating means 41 acquires operation information about the pressing of the left click from the operation detecting means 21 and stores the operation information in the operation information table 47 (Step S22 of FIG. 5). At the same time, the log data generating means 41 stores the history of the program function executed in response to the operation by the designer in the function history table 49 (Step S15 of FIG. 5).

Then, the designer moves the mouse to move the cursor 300 onto the start edit button 303 and presses the left click of the mouse to start the editing of the integrated circuit. By the operation, the integrated circuit "ALM_CPLD_EPM570F256C5" is determined as the target element on which the command is executed.

At this time, the log data generating means 41 acquires operation information about the pressing of the left click from the operation detecting means 21 and stores the operation information in the operation information table 47 (Step S22 of FIG. 5). At the same time, the log data generating means 41 stores the history of the program function executed in response to the operation by the designer in the function history table 49 (Step S15 of FIG. 5).

In addition, since the integrated circuit "ALM_CPLD_EPM570F256C5" selected from the list 302 is determined as the target element on which the command is executed (YES in Step S18 of FIG. 5), the log data generating means 41 stores the integrated circuit "ALM_CPLD_EPM570F256C5" in the element information table 48 (Step S19 of FIG. 5).

Figure 19:
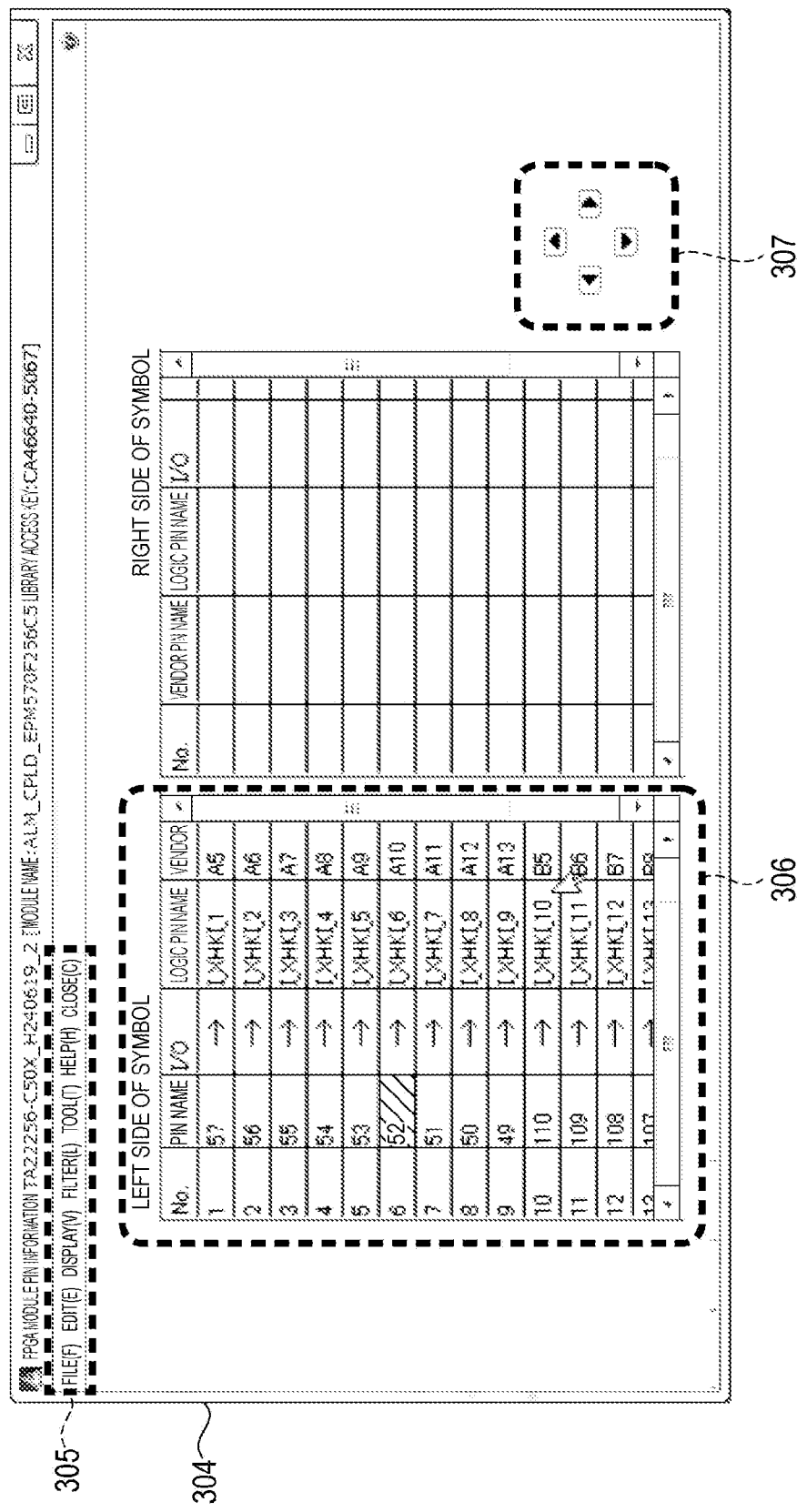
FIG. 19 is a view illustrating an example of a screen for an operation of editing pins in the integrated circuit in the fourth embodiment.

FIG. 19 is a view illustrating an example of a screen for an operation of editing pins in the integrated circuit in the third embodiment. When the start edit button 303 of FIG. 18 is pressed, a pin edit screen 304 illustrated in FIG. 19 is displayed on the output device 15. The pin edit screen 304 has a menu 305, a list 306 of pins included in the integrated circuit selected on the integrated-circuit-attribute change screen 301 of FIG. 18, and move buttons 307 including arrows in four directions (upward, downward, leftward, and rightward directions) for moving the pin selected from the list 306 to an arbitrary position.

Figure 20:
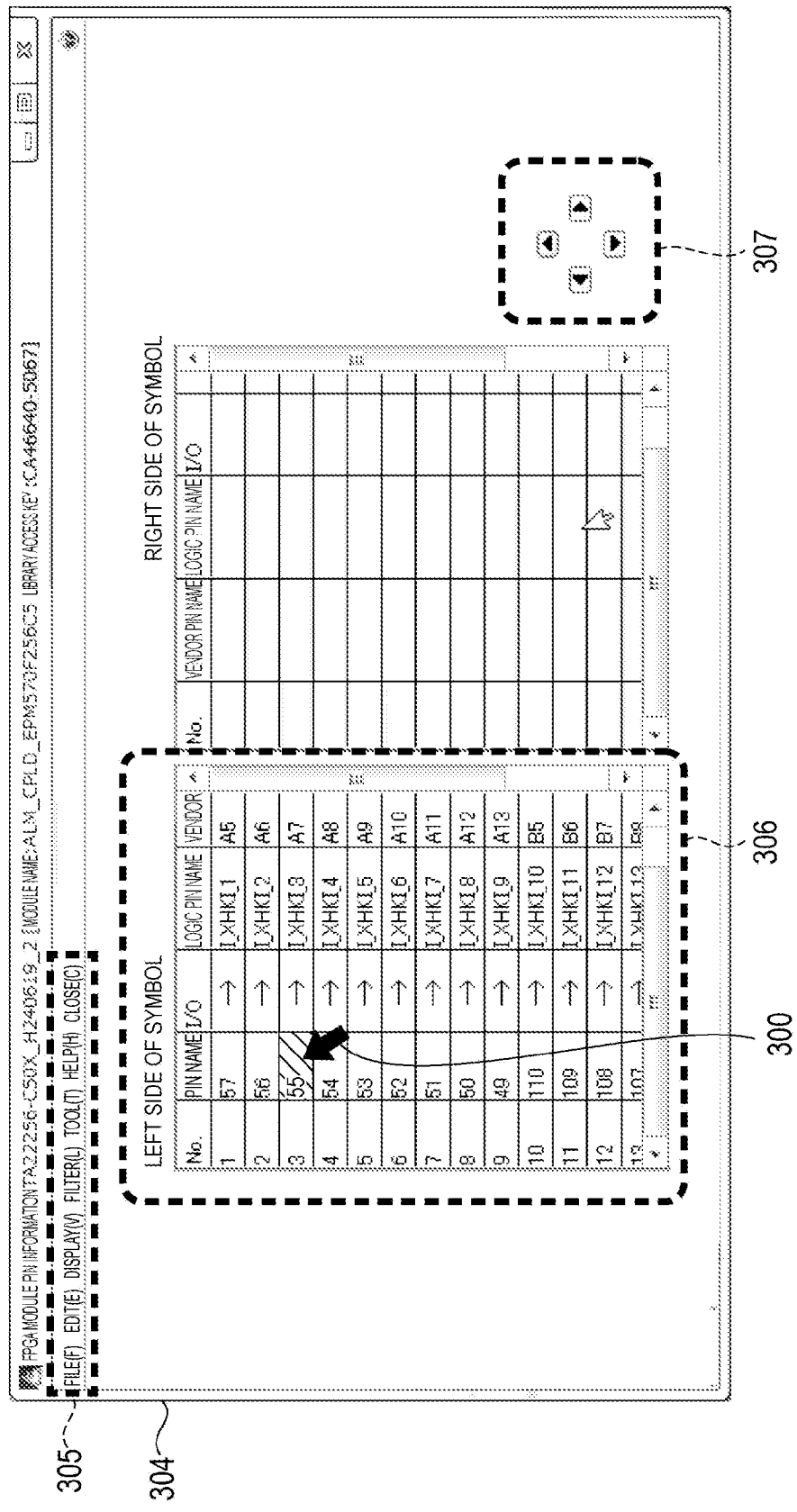
FIG. 20 is a view illustrating a first example of the operation of editing pins in the integrated circuit in the fourth embodiment.

FIG. 20 is a view illustrating a first example of the operation of editing pins in the integrated circuit in the third embodiment. In FIG. 20, the designer performs the operation of changing the placement of the pin "55" placed at the third position and the pin "53" placed at the fifth position from among the pins displayed in the list 306 of the pins.

First, the designer moves the mouse to move the cursor 300 onto the third row in second "pin name" column in the list 306 and presses the left click to select the pin "55" placed in the third row from the top.

At this time, the log data generating means 41 acquires operation information about the pressing of the left click on the third row in the second column in the list 306 from the operation detecting means 21 and stores the operation information in the operation information table 47 (Step S20 of FIG. 5). At the same time, the log data generating means 41 stores the history of the program function executed in response to the operation by the designer in the function history table 49 (Step S15 of FIG. 5).

Then, the designer moves the mouse to move the cursor 300 onto the move button 307 with the downward arrow and presses the left click to move the pin "55" from the third row to the fourth row, i.e., the fourth position. As a result, the pin "54" present in the fourth row is moved to the third row.

At this time, the log data generating means 41 acquires operation information about the pressing of the left click on the move button 307 with the downward arrow from the operation detecting means 21 and stores the operation information in the operation information table 47 (Step S20 of FIG. 5). At the same time, the log data generating means 41 stores the history of the program function executed in response to the operation by the designer in the function history table 49 (Step S15 of FIG. 5).

Next, the designer moves the cursor 300 onto the move button 307 with the downward arrow again and presses the left click to move the pin "55" from the fourth row to the fifth row, i.e., the fifth place. As a result, the pin "53" present in the fifth row is moved to the fourth row.

At this time, the log data generating means 41 acquires operation information about the pressing of the left click on the move button 307 with the downward arrow again from the operation detecting means 21 and stores the operation information in the operation information table 47 (Step S20 of FIG. 5). At the same time, the log data generating means 41 stores the history of the program function executed in response to the operation by the designer in the function history table 49 (Step S15 of FIG. 5).

Then, the designer moves the mouse to move the cursor 300 onto the fourth row in the second "Pin Name" column in the list 306 and presses the left click to select the pin "53" placed in the fourth row from the top.

At this time, the log data generating means 41 acquires operation information about the pressing of the left click on the fourth row in the second column in the list 306 and stores the operation information in the operation information table 47 (Step S20 of FIG. 5). At the same time, the log data generating means 41 stores the history of the program function executed in response to the operation by the designer in the function history table 49 (Step S15 of FIG. 5).

Then, the designer moves the mouse to move the cursor 300 onto the move button 307 with the upward arrow and presses the left click to move the pin "53" from the fourth row to the third row, i.e., the third position. As a result, the pin "54" present in the third row is moved to the fourth row.

At this time, the log data generating means 41 acquires operation information about the pressing of the left click on the move button 307 with the upward arrow from the operation detecting means 21 and stores the operation information in the operation information table 47 (Step S20 of FIG. 5). At the same time, the log data generating means 41 stores the history of the program function executed in response to the operation by the designer in the function history table 49 (Step S15 of FIG. 5).

Figure 21:
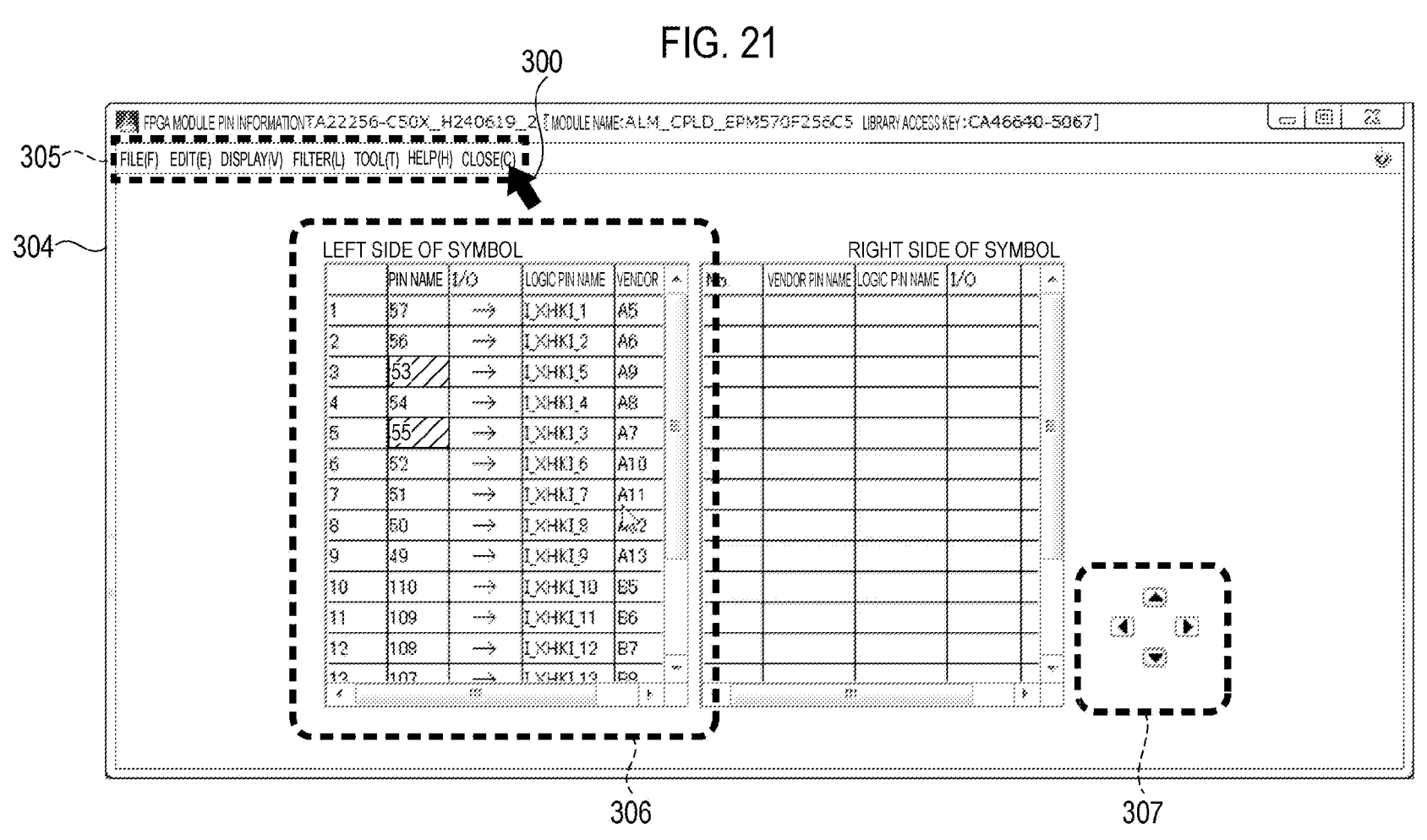

FIG. 21 is a view illustrating a second example of the operation of editing pins in the integrated circuit in the third embodiment. By the operation in FIG. 20, the pin "53" is moved to the fifth row in the second "Pin Name" column in the list 306 and the pin "55" is moved to the third row therein.

The designer moves the mouse to move the cursor 300 onto the "Close" button in the menu 305 and presses the left click. As a result, the "FPGA Editor" command is completed.

At this time, the log data generating means 41 acquires operation information about the pressing of the left click on the "Close" button from the operation detecting means 21 and stores the operation information in the operation information table 47 (Step S20 of FIG. 5). At the same time, the log data generating means 41 stores the history of the program function executed in response to the operation by the designer in the function history table 49 (Step S15 of FIG. 5).

In addition, since the operation of pressing the left click on the "Close" button corresponds also to the operation of completing the "FPGA Editor" command (YES in S21 of FIG. 5), the log data generating means 41 outputs the notification of the completion of the command to the log file (S24 of FIG. 5). After Step S24, the log data generating means 41 returns to Step S13 and initializes the operation information table 47, the element information table 48, and the function history table 49 (S13 of FIG. 5).

Figure 22:
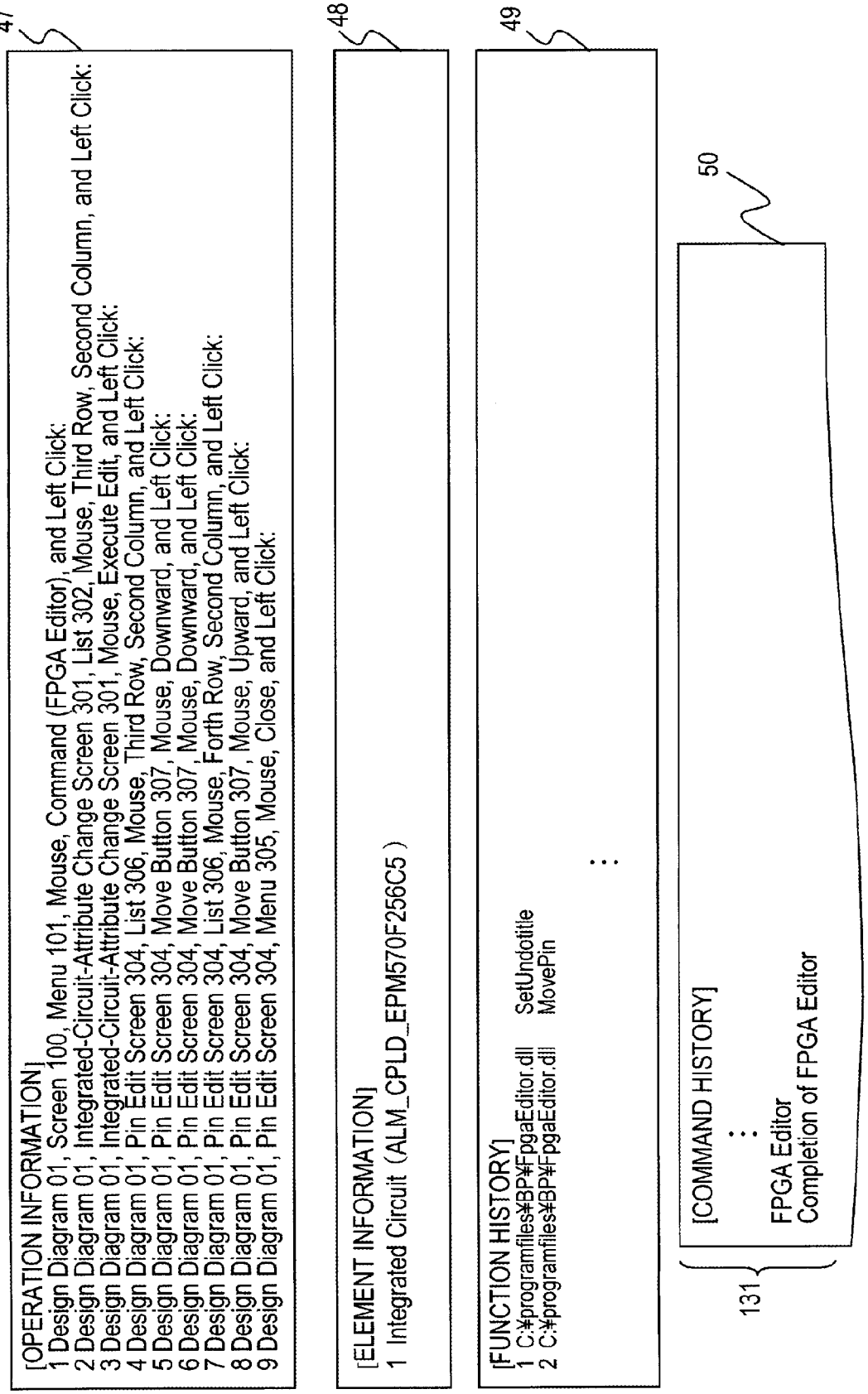
FIG. 22 is a view illustrating an example of the operation information table, the element information table, the function history table, and the log file at the completion of the "FPGA Editor" command in the third embodiment.

FIG. 22 is a view illustrating an example of the operation information table, the element information table, the function history table, and the log file at the completion of the "FPGA Editor" command in the third embodiment. FIG. 22 illustrates the operation information table 47, the element information table 48, the function history table 49, and the log file 50 when the log data generating means 41 has output the log file indicating the completion of the "FPGA Editor" command (Step S24 of FIG. 5).

In the first row of the operation information table 47 of FIG. 22, as illustrated in FIG. 17, the operation of pressing the left click of the mouse to select the "FPGA Editor" command in the menu 101 is stored as the operation information "Design Diagram 01, Screen 100, Menu 101, Mouse, Command (FPGA Editor), and Left Click".

In the second row, as illustrated in FIG. 18, the operation of pressing the left click of the mouse to select the third row in the second "Module" column in the list 302 on the integrated-circuit-attribute change screen 301 is stored as "Design Diagram 01, Integrated-Circuit-Attribute Change Screen 301, List 302, Mouse, Third Row, Second Column, and Left Click".

In the third row, the operation of pressing the left click of the mouse to select an execute edit button and start the editing of the integrated circuit is stored as the operation information "Design Diagram 01, Integrated-Circuit-Attribute Change Screen 301, Mouse, Execute Edit, and Left Click".

In the fourth to sixth rows, as illustrated in FIG. 20, the operation of selecting the third row (pin "55") in the second column in the list 306 on the pin edit screen 304 to move the pin "55" to the fifth row is stored. In the seventh and eighth rows, the operation of selecting the fourth row (pin "53") in the second column in the list 306 to move the pin "53" to the third row is stored.

In the ninth row, the performance of the operation of pressing the left click of the mouse to select the "Close" button in the menu 305 on the pin edit screen 304 is stored as "Design Diagram 01, Pin Edit Screen 304, Menu 305, Mouse, Close, and Left Click".

In the element information table 48 of FIG. 22, the integrated circuit "ALM_CPLD_EPM570F256C5" stored in the element information table 48 upon selection of the execute edit button on the integrated-circuit-attribute change screen 301 is stored.

In the function history table 49 of FIG. 22, the program functions executed in response to the operations by the designer in FIGS. 17 to 21 are stored in an ascending order. It is illustrated that, before the program function "SetUndotitle" in the module "FpgaEditor.dll" present in the path "C:¥ Programfiles¥ BP" in the uppermost first row was finally executed, a program function "MovePin" in the module "FpgaEditor.dll" present in the path "C:¥ Programfiles¥ BP" in the second row was executed.

In the command history section 141 of the log file 50 of FIG. 22, "Completion of FPGA Editor" indicating that the command was completed has been output to the row under the command name "FPGA Editor" (S24 of FIG. 5). Note that, to the rows above the "FPGA Editor", the names of the commands executed by the designer prior to the operation in FIG. 17 and the notifications of the completion of the commands have been output.

When the log data generating means 41 performs the initializing operation (S13 of FIG. 5) after outputting the notification of the completion of the "FPGA Editor" command to the log file (S24 of FIG. 5), the operation information, the elements, and the history of the program functions which have been stored in the respective tables 47 to 49 of FIG. 22 are all deleted.

Thus, in the normal operation of the "FPGA Editor" command, the log data generating means 41 stores the operation information during the period after the completion of the execution of the previous command and before the completion of the execution of the "FPGA Editor" command in the operation information table 47, stores the integrated circuit selected after the start of the "FPGA Editor" command in the element information table 48, and stores the executed function after the start of the "FPGA Editor" command in the function history table 49. When the execution of the "FPGA Editor" command is completed, the operation information, the element, and the history of the executed program function are no longer needed, and therefore the log data generating means 41 deletes the items from the respective tables instead of outputting the items to the log file 50.

Next, a description will be given of an example at the abnormal end of the design support program 40.

Figure 23:
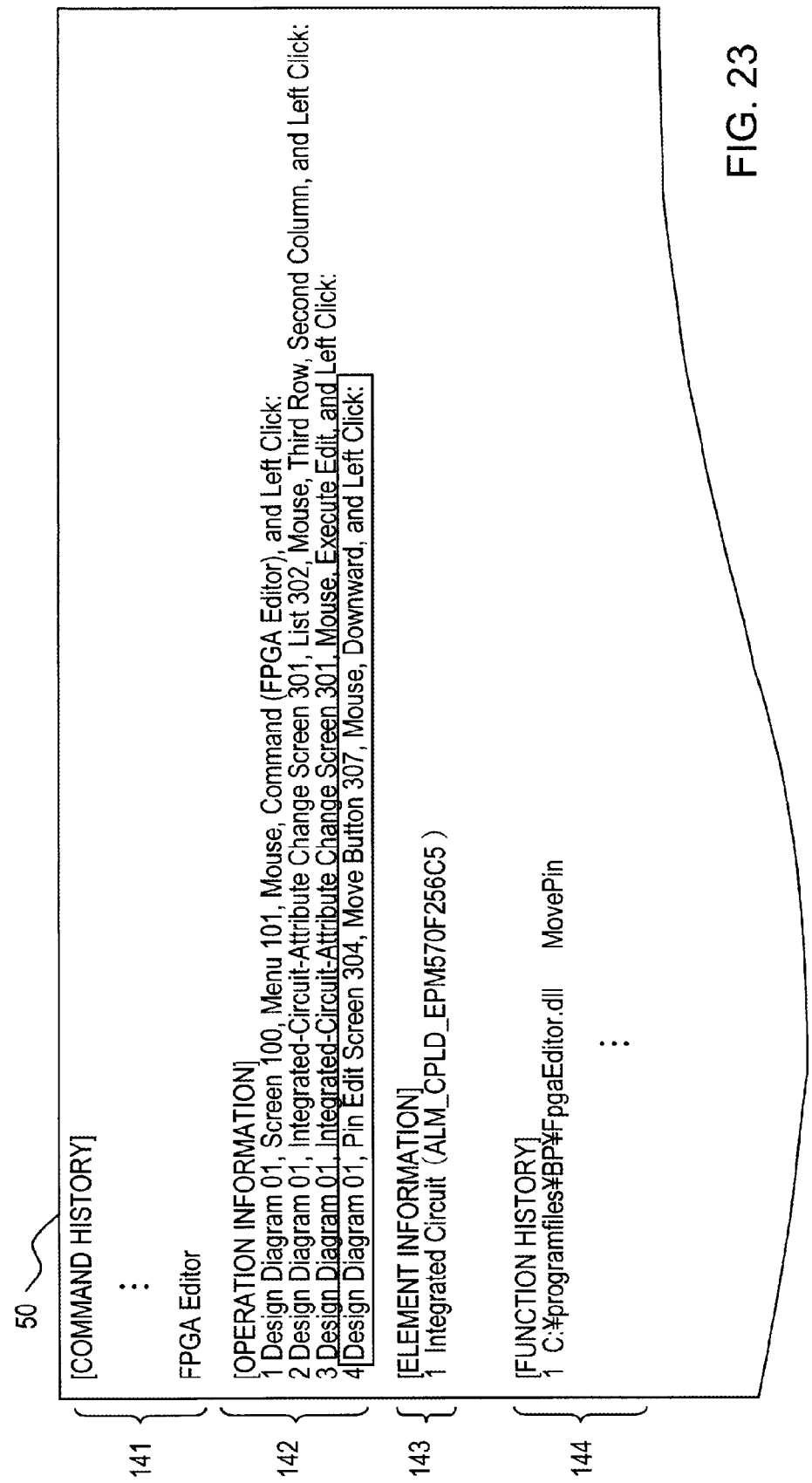
FIG. 23 illustrates an example of the log file output at the abnormal end in the second embodiment.

FIG. 23 illustrates an example of the log file output at the abnormal end in the second embodiment. For example, it is assumed that the design support program 40 was abnormally ended when the designer selected any of the move buttons 307 without selecting a target pin to be moved from the list 306 in FIG. 19 (YES in Step S31 of FIG. 6). In this case, the log data generating means 41 halts the operation in FIG. 5 (Step S32 of FIG. 6) and outputs the operation information table 47, the element information table 48, and the function history table 49 to the log file 50 (Step S33 of FIG. 6), as illustrated in FIG. 23.

In the command history section 141 of the log file 50 of FIG. 23, the command name "FPGA Editor" output from the log data generating means 41 in response to the selection of the "FPGA Editor" command has been output to the lowermost row (Step S17 of FIG. 5). To the operation information section 142, the operation information stored in the operation information table 47 by the time the log data generating means 41 halts the normal operation due to the abnormal end (Step S32 of FIG. 6) is output (Step S33 of FIG. 6). To the element information section 143, the elements stored in the element information table 48 by the time the log data generating means 41 halts the operation due to the abnormal end (Step S32 of FIG. 6) are output (Step S33 of FIG. 6). To the function history section 144, the program functions stored in the function history table 49 by the time the log data generating means 41 halts the operation due to the abnormal end (Step S32 of FIG. 6) are output (Step S33 of FIG. 6).

Upon receipt of an inquiry from the designer, the developer recognizes from the log file 50 of FIG. 23 that, on the integrated circuit "ALM_CPLD_EPM570F256C5" (the first row in the element information section 143), the "FPGA Editor" was executed (the first to third rows in the operation information section 142).

After selecting the execute edit button on the integrated-circuit-attribute change screen 301 (the third row in the operation information section 142), the developer also recognizes that the abnormal end occurred when the downward move button 307 on the pin edit screen 304 was selected (the fourth row in the operation information section 142).

Further, based on the function history section 144, the developer recognizes that the abnormal end occurred during the execution of the program function "MovePin" in the module "FpgaEditor.dll" present in the path "C:¥ Programfiles ¥ BP".

Then, the developer promptly responds to the abnormal end by receiving the design data "Design Diagram 01" being produced from the designer and operating the same operation as that performed by the designer based on the log file 50, debugging the program function "MovePin", or the like.

As a result, the developer finds the cause of the abnormal end which occurred for such a reason that, when, e.g., a target pin to be moved was not selected but the move button was selected, processing for outputting a warning message was not defined in the program function "MovePin" and the operation of causing the design support apparatus 30 to perform processing incompatible with the program function "MovePin" was performed.

When the abnormal end thus occurred, the log data generating means 41 halts the normal operation and outputs the operation information table 47, the element information table 48, and the function history table 49 at that time to the log file 50. This allows the developer to recognize the situation at the abnormal end based on the log file 50 and promptly respond to the abnormal end.

(Fourth Embodiment)

In the fourth embodiment, a description will be given of the operation of the design support program 40 when the designer has performed the operation of searching the element definition information table 23 for a component and placing the component in the design diagram display section 104. The description will be given first of an example during the normal operation of the design support program.

Figure 24:
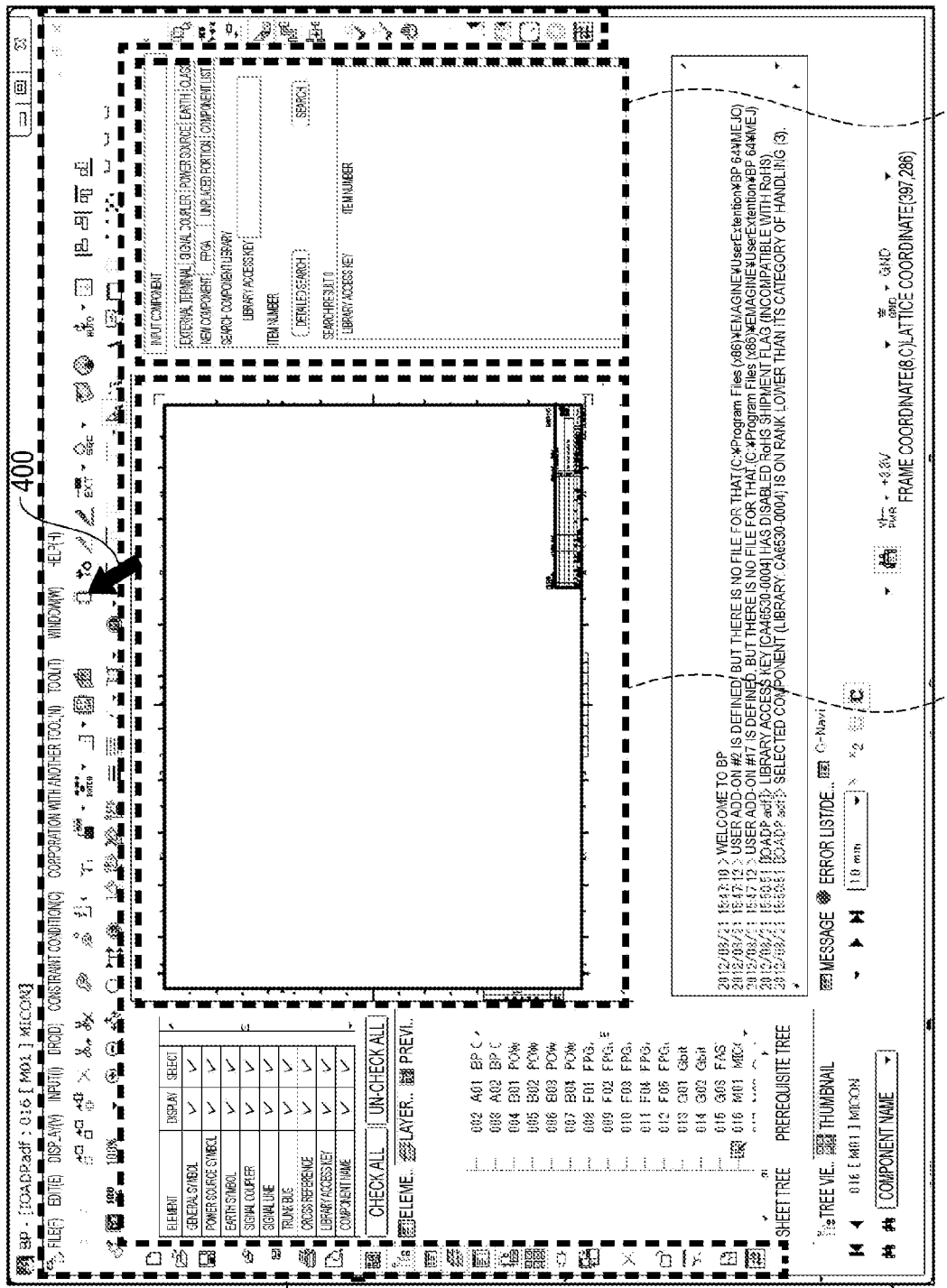
FIG. 24 is a view illustrating a first example of the screen displayed on the output device in the fourth embodiment.

FIG. 24 is a view illustrating a first example of the screen displayed on the output device in the fourth embodiment. FIG. 24 illustrates an example of the screen 100 when no element is placed in the design diagram display section 104.

First, the designer moves the mouse of the input device 14 to move a cursor 400 onto a "Place Component" command button in the menu 101 and presses the left click of the mouse to select the "Place Component" command button. As a result, the "Place Component" command is started.

At this time, the log data generating means 41 acquires operation information that the "Place Component" command is selected by pressing the left click from the operation detecting means 21 and stores the operation information in the operation information table 47 (Step S14 of FIG. 5). At the same time, the log data generating means 41 stores the history of the program function executed in response to the operation by the designer in the function history table 49 (Step S15 of FIG. 5). Since the operation information corresponds to the selection of the command (YES in Step S16 of FIG. 5), the selected "Place Component" command is output to the log file 50 (Step S17 of FIG. 5). However, since no element is selected (No in Step S18 of FIG. 5), no element is stored in the element information table 48 at that time.

Figure 25:
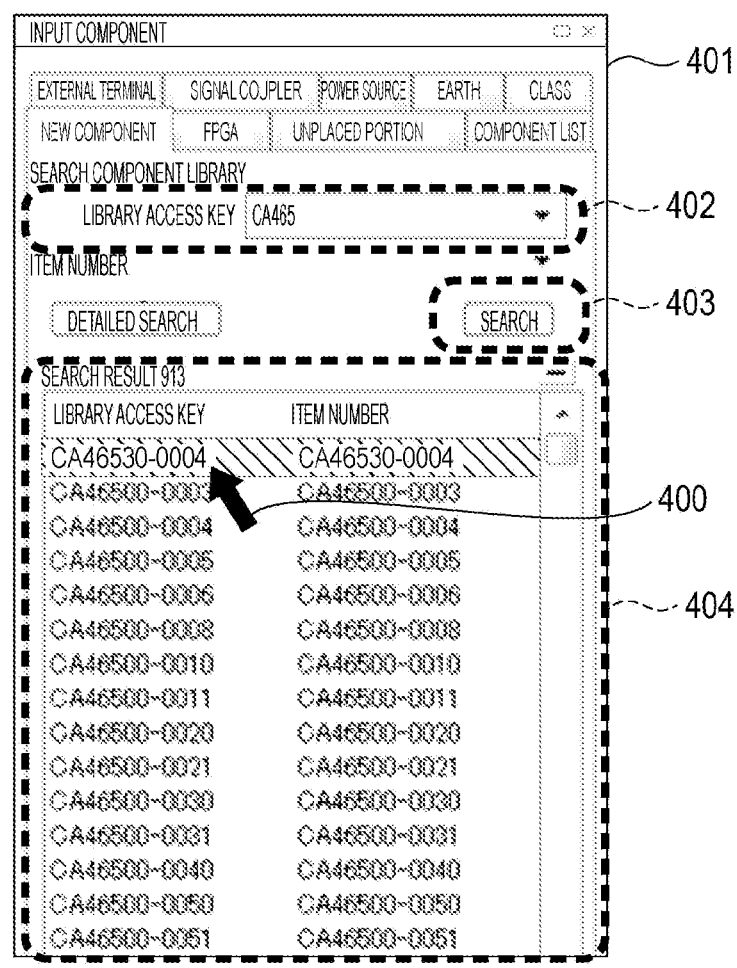
FIG. 25 illustrates an example of a component selecting section in the fourth embodiment.

FIG. 25 illustrates an example of a component selecting section in the fourth embodiment. When the "Place Component" command button in the menu 101 is selected in FIG. 24, a component input screen 401 in FIG. 25 is displayed in the component selecting section 105. The component input screen 401 has a library access key column 402 to which the model number of a component is input, a search button 403 for searching the element definition information table 23 for the element corresponding to the model number input to the library access key column 402, and a search result column 404 displaying the search result.

The designer moves the mouse to move the cursor 400 onto the library access key column 402 of the component input screen 401 and presses the left click of the mouse to select the library access key column 402.

At this time, the log data generating means 41 acquires operation information about the pressing of the left click on the library access key column 402 from the operation detecting means 21 and stores the operation information in the operation information table 47 (Step S22 of FIG. 5). At the same time, the log data generating means 41 stores the history of the program function executed in response to the operation by the designer in the function history table 49 (Step S15 of FIG. 5).

Then, the designer inputs the model number "CA465" to the library access key column 402 using the keyboard.

At this time, the log data generating means 41 acquires input operation information about the model number "CA465" from the operation detecting means 21 and stores the input operation information in the operation information table 47 (Step S22 of FIG. 5). At the same time, the log data generating means 41 stores the history of the program function executed in response to the operation by the designer in the function history table 49 (Step S15 of FIG. 5).

The designer moves the mouse to move the cursor 400 onto the search button 403 and presses the left click of the mouse to select the search button 403. As a result, the component corresponding to the model number "CA465" is retrieved from among the elements in the element definition information table 23. Then, as the search result, the model number including CA465 is displayed on the search result column 404.

At this time, the log data generating means 41 acquires operation information about the selection of the search button 403 from the operation detecting means 21 and stores the operation information in the operation information table 47 (Step S22 of FIG. 5). At the same time, the log data generating means 41 stores the history of the program function executed in response to the operation by the designer in the function history table 49 (Step S15 of FIG. 5).

The designer moves the mouse to move the cursor 400 onto the component "CA46500-0002" in the first row in the search result column 404 and presses the left click of the mouse to select the component "CA46500-0002". As a result, it is determined that the target element on which the "Place Component" command is executed is the component "CA46500-0002".

At this time, the log data generating means 41 acquires operation information about the selection of the component "CA46500-0002" from the operation detecting means 21 and stores the operation information in the operation information table 47 (Step S22 of FIG. 5). At the same time, the log data generating means 41 stores the history of the program function executed in response to the operation by the designer in the function history table 49 (Step S15 of FIG. 5). Since the component "CA46500-0002" is determined as the target element on which the command is executed (YES in Step S18 of FIG. 5), the log data generating means 41 further stores the component "CA46500-0002" in the element information table 48 (Step S19 of FIG. 5).

Figure 26:
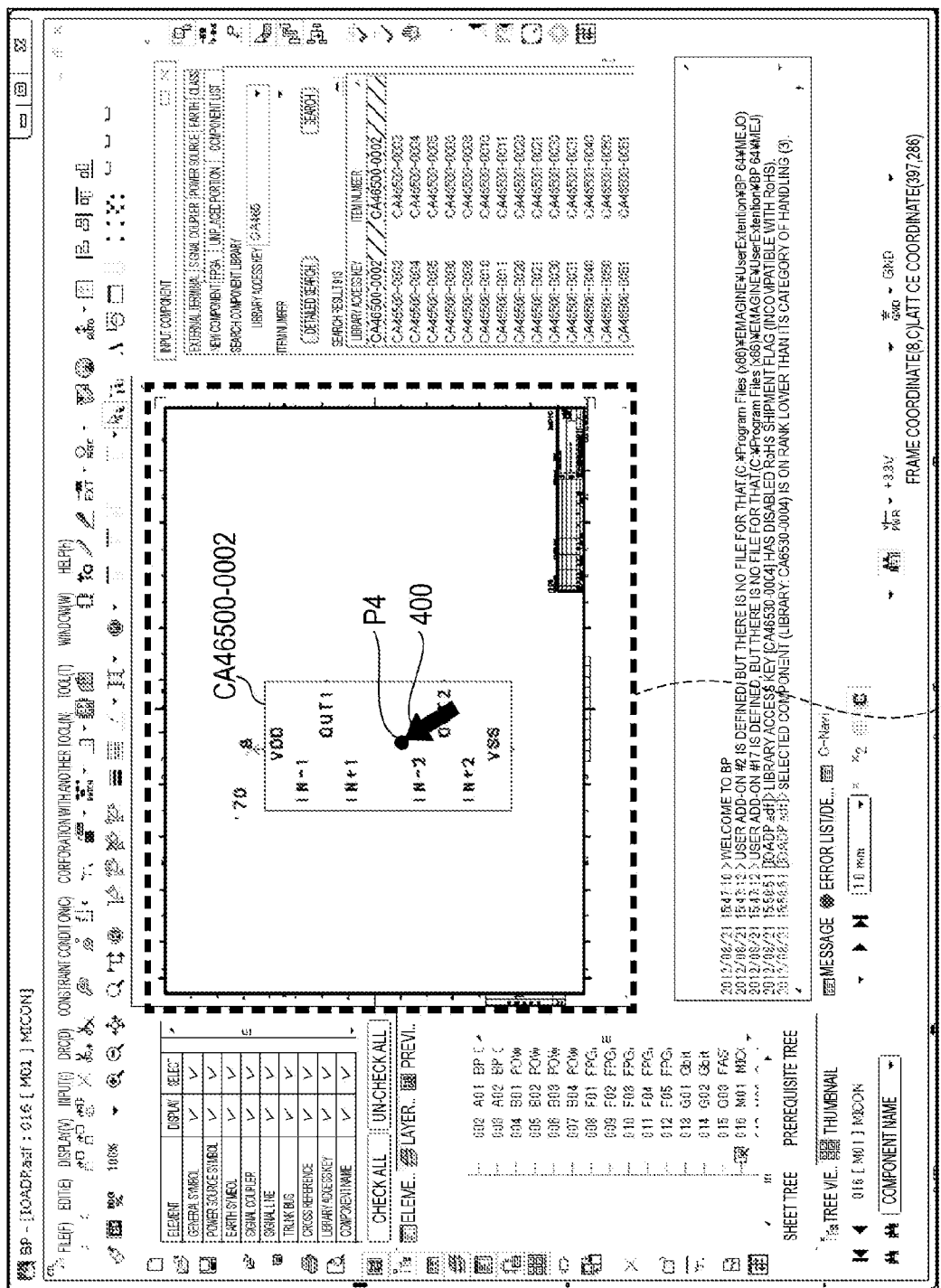
FIG. 26 is a view illustrating a second example of the screen displayed on the output device in the fourth embodiment.

FIG. 26 is a view illustrating a second example of the screen displayed on the output device in the fourth embodiment.

After selecting the component "CA46500-0002" on the component input screen 401 of FIG. 25, the designer moves the mouse to move the cursor 400 onto a coordinate P4 (X: 400 mm and Y: 210 mm) in the design diagram display section 104 of the screen 100 and presses the left click of the mouse, as illustrated in FIG. 26. As a result, the component "CA46500-0002" is placed at the coordinate P4 and the "Place Component" command is completed.

At this time, the log data generating means 41 acquires, from the operation detecting means 21, operation information about the operation of pressing the left click of the mouse on the coordinate P4 and stores the operation information in the operation information table 47 (Step S20 of FIG. 5). At the same time, the log data generating means 41 stores the history of the program function executed in response to the operation by the designer in the function history table 49 (Step S15 of FIG. 5).

In addition, since the operation of pressing the left click on the coordinate P4 corresponds also to the operation of completing the "Place Component" command (YES in S21 of FIG. 5), the log data generating means 41 outputs the notification of the completion of the command to the log file (S24 of FIG. 5). After Step S24, the log data generating means 41 returns to Step S13 and initializes the operation information table 47, the element information table 48, and the function history table 49 (S13 of FIG. 5).

FIG. 27 is a view illustrating an example of the operation information table, the element information table, the function history table, and the log file at the completion of the "Place Component" command in the fourth embodiment. FIG. 27 illustrates the operation information table 47, the element information table 48, the function history table 49, and the log file 50 when the log data generating means 41 has output the log file indicating the completion of the "Place Component" command (Step S24 of FIG. 5).

In the first row of the operation information table 47 of FIG. 27, as illustrated in FIG. 24, the operation of pressing the left click of the mouse to select the "Place Component" command button, which was performed to execute the "Place Component" command, is stored as the operation information "Design Diagram 01, Screen 100, Menu 101, Mouse, Command (Input Command), and Left Click".

In the second to eighth rows, as illustrated in FIG. 25, operation information about the selection of the library access key column 402 of the component input screen 401 (the second row), the inputting of the model number "CA465" (the third to seventh rows), and the selection of the search button 403 to search for a model number including "CA465" (the eighth row) is stored.

In the ninth row, the operation of pressing the left click of the mouse to select the first row (Component "CA46500-0002") in the search result is stored as the operation information "Design Diagram 01, Component Input Screen 401, Search Result Column 404, Mouse, First Row, and Left Click".

In the tenth row, as illustrated in FIG. 26, the operation of pressing the left click of the mouse on the coordinate P4 (X: 400 mm and Y: 210 mm) in the design diagram display section 104 to place the selected component "CA46500-0002" is stored as the operation information "Design Diagram 01, Screen 100, Mouse, x: 400 mm and y: 210 mm, and Left Click".

In the element information table 48 of FIG. 27, the component "CA46500-0002" selected from the search result is stored.

In the function history table 49 of FIG. 27, the program functions executed in response to the operations by the designer in FIGS. 24 to 26 are stored in an ascending order. It is illustrated that, before the program function "SetUndotitle" in a module "ToolAddFig.dll" present in the path "C:¥ Programfiles¥ BP" in the uppermost first row was finally executed, a program function "AddFig" in the module "ToolAddFig.dll" present in the path "C:¥ Programfiles¥ BP" in the second row was executed.

In the command history section 141 of the log file 50 of FIG. 27, "Completion of Component Placement" indicating that the command was completed has been output to the row under the command name "Place Component" (S24 of FIG. 5). Note that, to the rows above the "Place Component", the names of the commands executed prior to the operation in FIG. 24 and the notifications of the completion of the commands have been output.

When the log data generating means 41 performs the initializing operation (S13 of FIG. 5) after outputting the notification of the completion of the "Place Component" command to the log file (S24 of FIG. 5), the operation information, the elements, and the history of the executed program functions which have been stored in the respective tables 47 to 49 are all deleted.

Thus, in the normal operation of the "Place Component" command, the log data generating means 41 stores the operation information during the period after the completion of the execution of the previous command and before the completion of the execution of the "Place Component" command in the operation information table 47, stores the element selected from the search result in the element definition information table 23 in the element information table 48, and stores the executed function in the function history table 49. When the execution of the "Place Component" command is completed, the operation information, the element, and the history of the executed program function are no longer needed, and therefore the log data generating means 41 deletes these items from the respective tables instead of outputting the items to the log file 50.

Next, a description will be given of an example at the abnormal end of the design support program 40.

FIG. 28 illustrates an example of the log file which is output at the abnormal end in the fourth embodiment.

It is assumed that the design support program 40 was abnormally ended when, e.g., the designer input a model number "CA999" to the library access key in FIG. 25 to search the element definition information table 23, a model number including "CA999" was not present in the element definition information table 23 and the search resulted in zero hits (YES in Step S31 of FIG. 6). In this case, the log data generating means 41 halts the operation in FIG. 5 (Step S32 of FIG. 6) and outputs the operation information table 47, the element information table 48, and the function history table 49 to the log file 50 (Step S33 of FIG. 6), as illustrated in FIG. 28.

In the command history section 141 of the log file 50 of FIG. 28, the command name "Place Component" output from the log data generating means 41 in response to the selection of the "Place Component" command has been output to the lowermost row (Step S17 of FIG. 5). In the operation information section 142, the operation information stored in the operation information table 47 by the time the log data generating means 41 halts the normal operation due to the abnormal end (Step S32 of FIG. 6) is output (Step S33 of FIG. 6).

To the element information section 143, the element stored in the element information table 48 by the time the log data generating means 41 halts the operation due to the abnormal end (Step S32 of FIG. 6) is output (Step S33 of FIG. 6). Note that, since no element was stored in the element information table 48 at the time when the abnormal end occurred in FIG. 28, the element information section 143 has zero elements. To the function history section 144, the program function stored in the function history table 49 by the time the log data generating means 41 halts the operation due to the abnormal end (Step S32 of FIG. 6) is output (Step S33 of FIG. 6).

Upon receipt of an inquiry from the designer, the developer recognizes from the operation information section 142 of the log file 50 of FIG. 28 that the abnormal end occurred when the "Place Component" command was executed from the menu 101 of the screen 100 (the first row in the operation information section 142) and "CA999" was input to the library access key column 402 of the component input screen 401 (the second to eighth rows in the operation information section 142).

Further, based on the function history section 144, the developer recognizes that the abnormal end occurred during the execution of the program function "AddFig" in the module "ToolAddFig" present in the path "C:¥ Programfiles ¥ BP".

Then, the developer can promptly respond to the abnormal end by receiving the design data "Design Diagram 01" being produced from the designer and performing the same operation as that performed by the designer based on the log file 50, debugging the program function "AddFig", or the like.

As a result, the developer finds the cause of the abnormal end which occurred for such a reason that, when, e.g., the search resulted in zero hits, processing for outputting a warning message was not defined in the program function "AddFig" and the operation of causing the design support apparatus 30 to perform processing incompatible with the program function "AddFig" was performed.

When the abnormal end thus occurred, the log data generating means 41 halts the normal operation and outputs the operation information table 47, the element information table 48, and the function history table 49 at that time to the log file 50. This allows the developer to recognize the situation at the abnormal end based on the log file 50 and promptly correspond to the abnormal end.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory computer readable storage medium storing a design support program which causes a computer to generate design data for a circuit board in which elements are placed, the program causing the computer to perform:
   storing, in response to an operation input, operation information in an operation information storage section;
   storing a function of a program executed based on the operation input in a function history storage section;
   upon detection of an operation of a command causing the computer to execute a predetermined function for generating the design data, acquiring a selected one of the elements and storing the selected element in an element information storage section; and
   detecting an abnormal end of the predetermined function to output the function of the program in the function history storage section, the operation information in the operation information storage section, and the selected element in the element information storage section to a log file.

2. The non-transitory computer readable storage medium storing the design support program according to claim 1, further causing the computer to perform:
   initializing the function history storage section, the operation information storage section, and the element information storage section, upon detection of a normal end of the predetermined function.

3. The non-transitory computer readable storage medium storing the design support program according to claim 1, wherein, when the operation input is an operation input causing the computer to execute processing incompatible with the function of the program, the detecting the abnormal end is performed.

4. The non-transitory computer readable storage medium storing the design support program according to claim 3,
   wherein the predetermined function is a change of a name of the selected element, and
   wherein, when the operation input is an operation input to input a name which is not defined to be inputtable by the function of the program, the detecting the abnormal end is performed.

5. The non-transitory computer readable storage medium storing the design support program according to claim 3,
   wherein the predetermined function is a movement of the selected element, and
   wherein, when the operation input is an operation input to move the selected element onto another element, the detecting the abnormal end is performed.

6. The non-transitory computer readable storage medium storing the design support program according to claim 3,
   wherein the predetermined function is a change of placement of a pin in an integrated circuit being the selected element, and
   wherein, when the operation input is an operation input to move a pin without specifying a target pin the placement of which is to be changed, the detecting the abnormal end is performed.

7. The non-transitory computer readable storage medium storing the design support program according to claim 3, wherein, when the operation input is an operation input to search for an element which does not exist in element definition information which defines the element, the detecting the abnormal end is performed.

8. The non-transitory computer readable storage medium storing the design support program according to claim 1, wherein, when storing the selected element in the element information storage section, the element selected by an operation input prior to the operation of the command is acquired and the selected element is stored in the element information storage section.

9. The non-transitory computer readable storage medium storing the design support program according to claim 1, wherein, when storing the selected element in the element information storage section, the element selected by an operation input subsequent to the operation of the command is acquired and the selected element is stored in the element information storage section.

10. A design support method, which causes a computer to generate design data for an integrated circuit in which elements are placed, the method comprising:
- causing the computer to store, in response to an operation input, operation information in an operation information storage section;
- causing the computer to store a function of a program executed based on the operation input in a function history storage section;
- causing the computer to acquire, upon detection of an operation of a command causing the computer to execute a predetermined function for generating the design data, a selected one of the elements and store the selected element in an element information storage section; and
- causing the computer to detect an abnormal end of the predetermined function and output the function of the program in the function history storage section, the operation information in the operation information storage section, and the selected element in the element information storage section to a log file.

11. A design support apparatus which generates design data for an integrated circuit in which elements are placed, the apparatus comprising:
- an operation information storing unit configured to store, in response to an operation input, operation information in an operation information storage section;
- an executed function storing unit configured to store a function of a program executed based on the operation input in a function history storage section;
- an element information storing unit configured to acquire, upon inputting of an operation of a command causing the design support apparatus to execute a predetermined function for generating the design data, a selected one of the elements and store the selected element in an element information storage section; and
- a log output unit configured to detect an abnormal end of the predetermined function and output the function of the program in the function history storage section, the operation information in the operation information storage section, and the selected element in the element information storage section to a log file.

* * * * *